United States Patent
Ogihara et al.

(10) Patent No.: US 8,026,038 B2
(45) Date of Patent: *Sep. 27, 2011

(54) METAL OXIDE-CONTAINING FILM-FORMING COMPOSITION, METAL OXIDE-CONTAINING FILM, METAL OXIDE-CONTAINING FILM-BEARING SUBSTRATE, AND PATTERNING METHOD

(75) Inventors: Tsutomu Ogihara, Joetsu (JP); Takafumi Ueda, Joetsu (JP); Toshiharu Yano, Joetsu (JP); Mutsuo Nakashima, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 303 days.

This patent is subject to a terminal disclaimer.

(21) Appl. No.: 12/275,088

(22) Filed: Nov. 20, 2008

(65) Prior Publication Data

US 2009/0136869 A1    May 28, 2009

(30) Foreign Application Priority Data

Nov. 22, 2007  (JP) ................................. 2007-303130

(51) Int. Cl.
G03F 7/00 (2006.01)
G03F 7/004 (2006.01)
G03F 7/26 (2006.01)
G03F 7/11 (2006.01)
G03F 7/40 (2006.01)

(52) U.S. Cl. .................. 430/270.1; 430/272.1; 430/311; 430/313; 430/317; 430/322; 430/323; 430/325; 430/326; 430/331

(58) Field of Classification Search .............. 430/270.1, 430/272.1, 311, 313, 317, 322, 323, 325, 430/326, 331

See application file for complete search history.

(56) References Cited

U.S. PATENT DOCUMENTS

| | | |
|---|---|---|
| 5,385,804 A | 1/1995 | Premlatha et al. |
| 5,632,910 A | 5/1997 | Nagayama et al. |
| 6,013,416 A | 1/2000 | Nozaki et al. |
| 6,025,117 A | 2/2000 | Nakano et al. |
| 6,280,898 B1 | 8/2001 | Hasegawa et al. |
| 6,329,125 B2 | 12/2001 | Takechi et al. |
| 6,503,692 B2 | 1/2003 | Angelopoulos et al. |
| 6,703,183 B2 | 3/2004 | Nishi et al. |
| 7,303,785 B2 | 12/2007 | Ogihara et al. |
| 7,303,855 B2 | 12/2007 | Hatakeyama et al. |
| 7,432,035 B2 | 10/2008 | Maeda et al. |
| 2001/0026901 A1 | 10/2001 | Maeda et al. |
| 2002/0187422 A1 | 12/2002 | Angelopoulos et al. |
| 2003/0091929 A1 | 5/2003 | Nishi et al. |
| 2004/0253461 A1 | 12/2004 | Ogihara et al. |
| 2005/0106499 A1 | 5/2005 | Harada et al. |
| 2006/0019195 A1 | 1/2006 | Hatakeyama et al. |
| 2007/0134916 A1* | 6/2007 | Iwabuchi et al. ............ 438/636 |
| 2008/0026322 A1* | 1/2008 | Ogihara et al. ............ 430/270.1 |

FOREIGN PATENT DOCUMENTS

| | | |
|---|---|---|
| EP | 1375615 A2 | 1/2004 |
| EP | 1788012 A1 | 5/2007 |
| EP | 1788433 A2 | 5/2007 |
| EP | 1788433 A2 * | 5/2007 |
| EP | 1845132 A2 * | 10/2007 |
| EP | 1867681 A1 * | 12/2007 |
| EP | 2 011 829 A1 | 1/2009 |
| EP | 2 063 319 A1 | 5/2009 |
| JP | 5-291208 A | 11/1993 |
| JP | 6-95385 A | 4/1994 |
| JP | 7-181688 A | 7/1995 |
| JP | 7-183194 A | 7/1995 |
| JP | 8-12626 A | 1/1996 |
| JP | 9-73173 A | 3/1997 |
| JP | 11-60735 A | 3/1999 |
| JP | 2000-159758 A | 6/2000 |
| JP | 2003-84438 A | 3/2003 |
| JP | 2004-153125 A | 5/2004 |
| JP | 2004-157469 A | 6/2004 |
| JP | 2004-191386 A | 7/2004 |
| JP | 2004-349572 A | 12/2004 |
| JP | 2005-15779 A | 1/2005 |
| JP | 2005-128509 A | 5/2005 |
| JP | 2005-146252 A | 6/2005 |
| JP | 2005-520354 A | 7/2005 |
| JP | 2007-163846 A | 6/2007 |
| WO | WO-00/01684 A1 | 1/2000 |
| WO | WO-2006/040956 A1 | 4/2006 |

OTHER PUBLICATIONS

Japanese Office Action for Applicaiton No. JP-2007-303130, dated Apr. 28, 2010.
Sugita et al., J. Appl. Pollym. Sci., vol. 88, 636-640 (2003) . . . i.
C. J. Brinker et al., Academic Press, San Diego (1990) . . . ii.
Ito et al., Polym. Matter. Sci. Eng., 1997,77, pp. 449 . . . iii.
Extended European Search Report issued on Jan. 28, 2010 in European Patent Application No. 09012329.0.
Extended European Search Report issued on Jan. 29, 2010 in European Patent Application No. 09012327.4.

* cited by examiner

*Primary Examiner* — Amanda C. Walke

(74) *Attorney, Agent, or Firm* — Birch, Stewart, Kolasch & Birch, LLP

(57) ABSTRACT

A metal oxide-containing film is formed from a heat curable composition comprising (A) a metal oxide-containing compound obtained through hydrolytic condensation between a hydrolyzable silicon compound and a hydrolyzable metal compound, (B) a hydroxide or organic acid salt of Li, Na, K, Rb or Cs, or a sulfonium, iodonium or ammonium compound, (C) an organic acid, and (D) an organic solvent. The metal oxide-containing film ensures effective pattern formation.

20 Claims, No Drawings

METAL OXIDE-CONTAINING FILM-FORMING COMPOSITION, METAL OXIDE-CONTAINING FILM, METAL OXIDE-CONTAINING FILM-BEARING SUBSTRATE, AND PATTERNING METHOD

CROSS-REFERENCE TO RELATED APPLICATION

This non-provisional application claims priority under 35 U.S.C. §119(a) on Patent Application No. 2007-303130 filed in Japan on Nov. 22, 2007, the entire contents of which are hereby incorporated by reference.

TECHNICAL FIELD

This invention relates to a metal oxide-containing film-forming composition suitable for forming a metal oxide-containing film for use as an intermediate layer in a multilayer resist process which is used in micropatterning in the manufacturing process of semiconductor devices and the like, especially for forming such a metal oxide-containing film by spin coating; a metal oxide-containing film formed therefrom; a metal oxide-containing film-bearing substrate; and a patterning method using the same.

BACKGROUND ART

In the drive for higher integration and operating speeds in LSI devices, the pattern feature size is made drastically finer. Under the miniaturizing trend, the lithography has achieved formation of finer patterns by using a light source with a shorter wavelength and by a choice of a proper resist composition for the shorter wavelength. Predominant among others are positive photoresist compositions which are used as a single layer. These single-layer positive photoresist compositions are based on resins possessing a framework having resistance to dry etching with chlorine or fluorine gas plasma and provided with a resist mechanism that exposed areas become dissolvable. Typically, the resist composition is coated on a substrate to be processed (referred to as "processable substrate," hereinafter) and exposed to a pattern of light, after which the exposed areas of the resist coating are dissolved to form a pattern. Then, the substrate can be processed by dry etching with the remaining resist pattern serving as an etching mask.

In an attempt to achieve a finer feature size, i.e., to reduce the pattern width with the thickness of a photoresist coating kept unchanged, the photoresist coating becomes low in resolution performance. If the photoresist coating is developed with a liquid developer to form a pattern, the so-called "aspect ratio" (depth/width) of the resist pattern becomes too high, resulting in pattern collapse. For this reason, the miniaturization is accompanied by a thickness reduction of the photoresist coating (thinner coating).

On the other hand, a method commonly used for the processing of a processable substrate is by processing a substrate by dry etching with the patterned photoresist film made an etching mask. Since a dry etching method capable of establishing a full etching selectivity between the photoresist film and the processable substrate is not available in practice, the resist film is also damaged during substrate processing. That is, the resist film breaks down during substrate processing, failing to transfer the resist pattern to the processable substrate faithfully. As the pattern feature size is reduced, resist materials are required to have higher resistance to dry etching.

With the progress of the exposure wavelength toward a shorter wavelength, the resin in resist compositions is required to have less light absorption at the exposure wavelength. In response to changes from i-line to KrF and to ArF, the resin has made a transition to novolac resins, polyhydroxystyrene and aliphatic polycyclic skeleton resins. Actually, the etching rate under the above-indicated dry etching conditions has been accelerated. Advanced photoresist compositions featuring a high resolution tend to be rather low in etching resistance. This suggests the inevitableness that a processable substrate is dry etched through a thinner photoresist coating having weaker etching resistance. It is urgently required to have the material and process suited in this processing stage.

One solution to these problems is a multilayer resist process. The process involves forming an intermediate film on a processable substrate, forming a photoresist film (resist overcoat film) thereon, wherein the intermediate film with different etching selectivity from the resist overcoat film intervenes between the resist overcoat film and the processable substrate, patterning the resist overcoat film, dry etching the intermediate film through the overcoat resist pattern as an etching mask for thereby transferring the pattern to the intermediate film, and dry etching the processable substrate through the intermediate film pattern as an etching mask for thereby transferring the pattern to the processable substrate.

Included in the multilayer resist process is a bi-layer resist process. One exemplary bilayer resist process uses a silicon-containing resin as the overcoat resist material and a novolac resin as the intermediate film (e.g., JP-A 6-95385). The silicon resin exhibits good resistance to reactive dry etching with an oxygen plasma, but is readily etched away with a fluorine gas plasma. On the other hand, the novolac resin is readily etched away by reactive dry etching with an oxygen gas plasma, but exhibits good resistance to dry etching with fluorine and chlorine gas plasmas. Thus, a novolac resin film is formed on a processable substrate as a resist intermediate film, and a silicon-containing resin is coated thereon as a resist overcoat film. Subsequently, the silicon-containing resist film is patterned by exposure to energy radiation and post-treatments including development. While the patterned silicon-containing resist film serves as an etching mask, reactive dry etching with an oxygen plasma is carried out for etching away a portion of the novolac resin where the resist pattern has been removed, thereby transferring the pattern to the novolac film. While the pattern transferred to the novolac film serves as an etching mask, the processable substrate is etched with a fluorine or chlorine gas plasma for transferring the pattern to the processable substrate.

In the pattern transfer by dry etching, a transfer pattern having a relatively good profile is obtained if the etching mask has a satisfactory etching resistance. Since problems like pattern collapse caused by such factors as friction by a developer during resist development are unlikely to occur, a pattern having a relatively high aspect ratio is produced. Therefore, even though a fine pattern could not be formed directly from a resist film of novolac resin having a thickness corresponding to the thickness of an intermediate film because of pattern collapse during development due to the aspect ratio problem, the use of the bi-layer resist process enables to produce a fine pattern of novolac resin having a sufficient thickness to serve as a mask for dry etching of the processable substrate.

Also included in the multilayer resist process is a tri-layer resist process which can use general resist compositions as used in the single-layer resist process. In the tri-layer resist process, for example, an organic film of novolac resin or the like is formed on a processable substrate as a resist undercoat film, a silicon-containing film is formed thereon as a resist intermediate film, and an ordinary organic photoresist film is formed thereon as a resist overcoat film. On dry etching with a fluorine gas plasma, the resist overcoat film of organic nature provides a satisfactory etching selectivity ratio relative to the silicon-containing resist intermediate film. Then, the resist pattern is transferred to the silicon-containing resist intermediate film by dry etching with a fluorine gas plasma. With this process, even on use of a resist composition which is difficult to form a pattern having a sufficient thickness to allow for direct processing of a processable substrate, or a resist composition which has insufficient dry etching resistance to allow for substrate processing, a pattern of novolac film having sufficient dry etching resistance to allow for substrate processing is obtainable like the bilayer resist process, as long as the pattern can be transferred to the silicon-containing film.

The silicon-containing resist intermediate films used in the tri-layer resist process described above include silicon-containing inorganic films deposited by CVD, such as $SiO_2$ films (e.g., JP-A 7-183194) and SiON films (e.g., JP-A 7-181688); and films formed by spin coating, such as spin-on-glass (SOG) films (e.g., JP-A 5-291208, J. Appl. Polym. Sci., Vol. 88, 636-640 (2003)) and crosslinkable silsesqutoxane films (e.g., JP-A 2005-520354). Polysilane films (e.g., JP-A 11-60735) would also be useful. Of these, the $SiO_2$ and SiON films have a good function as a dry etching mask during dry etching of an underlying organic film, but require a special equipment for their deposition. By contrast, the SOG films, crosslinkable silsesquioxane films and polysilane films are believed high in process efficiency because they can be formed simply by spin coating and heating.

The applicable range of the multilayer resist process is not restricted to the attempt of increasing the maximum resolution of resist film. For example, in a via-first method which is one of substrate processing methods where an intermediate substrate to be processed has large steps, an attempt to form a pattern with a single resist film encounters problems like inaccurate focusing during resist exposure because of a substantial difference in resist film thickness. In such a case, steps are buried by a sacrificial film for planarization, after which a resist film is formed thereon and patterned. This situation entails inevitable use of the multilayer resist process mentioned above (e.g., JP-A 2004-349572).

While silicon-containing films are conventionally used in the multilayer resist process, they suffer from several problems. For example, as is well known in the art, where an attempt is made to form a resist pattern by photolithography, exposure light is reflected by the substrate and interferes with the incident light, incurring the problem of so-called standing waves. To produce a microscopic pattern of a resist film without edge roughness, an antireflective coating (ARC) must be provided as an intermediate layer. Reflection control is essential particularly under high-NA exposure conditions of the advanced lithography.

In the multilayer resist process, especially the process of forming a silicon-containing film as an intermediate layer by CVD, it becomes necessary for reflection control purposes to provide an organic antireflective coating between the resist overcoat film and the silicon-containing intermediate film. However, the provision of the organic ARC entails the necessity that the organic ARC be patterned with the resist overcoat film made a dry etching mask. That is, the organic ARC is dry etched with the resist overcoat film made a dry etching mask, after which the process proceeds to processing of the silicon-containing intermediate layer. Then the overcoat photoresist must bear an additional load of dry etching corresponding to the processing of the ARC. While photoresist films used in the advanced lithography become thinner, this dry etching load is not negligible. Therefore, greater attention is paid to the tri-layer resist process in which a light-absorbing silicon-containing film not creating such an etching load is applied as an intermediate film.

Known light-absorbing silicon-containing intermediate films include light-absorbing silicon-containing films of spin coating type. For example, JP-A 2005-15779 discloses the provision of an aromatic structure as the light-absorbing structure. Since the aromatic ring structure capable of effective light absorption acts to reduce the rate of dry etching with a fluorine gas plasma, this approach is disadvantageous for the purpose of dry etching the intermediate film without an additional load to the photoresist film. Since it is thus undesirable to incorporate a large amount of such light-absorbing substituent groups, the amount of incorporation must be limited to the minimum.

Further, the dry etching rate of the resist undercoat film during reactive dry etching with an oxygen gas plasma as commonly used in the processing of the resist undercoat film with the intermediate film made a dry etching mask is preferably low so as to increase the etching selectivity ratio between the intermediate film and the undercoat film. To this end, the intermediate film is desired to have a higher content of silicon which is highly reactive with fluorine etchant gas. The requirement arising from the conditions of processing both the overcoat or photoresist film and the undercoat or organic film gives preference to an intermediate film having a higher content of silicon which is highly reactive with fluorine gas.

In actual silicon-containing intermediate film-forming compositions of spin coating type, however, organic substituent groups are incorporated into the silicon-containing compounds so that the silicon-containing compounds may be dissolvable in organic solvents. Of the silicon-containing intermediate films known in the art, an SOG film-forming composition adapted for KrF excimer laser lithography is disclosed in J. Appl. Polym. Sci., Vol. 88, 636-640 (2003). However, since light-absorbing groups are described nowhere, it is believed that this composition forms a silicon-containing film without an antireflective function. This film fails to hold down reflection during exposure by the lithography using the advanced high-NA exposure system. It would be impossible to produce microscopic pattern features.

In the advanced semiconductor process using such a high-NA exposure system, the photoresist film has seen a more outstanding reduction in thickness. Then in etching the silicon-containing intermediate film using a thin photoresist film as an etching mask, an attempt to increase the silicon content of the silicon-containing intermediate film while possessing an antireflection function, as such, is expected difficult to facilitate pattern transfer to the intermediate film. There is a demand for an intermediate film material having a higher etching rate.

In addition to the dry etching properties and antireflection effect, the composition for forming an intermediate film with a high silicon content suffers from several problems, of which shelf stability is most outstanding. The shelf stability relates to the phenomenon that a composition comprising a silicon-containing compound changes its molecular weight during shelf storage as a result of condensation of silanol groups on the silicon-containing compound. Such molecular weight changes show up as film thickness variations and lithography performance variations. In particular, the lithography performance is sensitive, and so, even when the condensation of silanol groups within the molecule takes place merely to such an extent that it does not show up as a film thickness buildup or molecular weight change, it can be observed as variations of microscopic pattern features.

As is known in the art, such highly reactive silanol groups can be rendered relatively stable if they are kept in acidic conditions. See C. J. Brinker and G. W. Scherer, "Sol-Gel Science: The Physics and Chemistry of Sol-Gel Processing," Academic Press, San Diego (1990). Further, addition of water improves the shelf stability as disclosed in J. Appl. Polym. Sci., Vol. 88, 636-640 (2003), JP-A 2004-157469 and JP-A 2004-191386. However, the silicon-containing compounds prepared by the methods of these patent publications are not inhibited completely from condensation reaction of silanol groups even when any of these means is taken. The silicon-containing compound in the composition slowly alters with the passage of time, and a silicon-containing film formed from such an altered composition changes in nature. Then the composition must be held in a refrigerated or frozen state just until use, and on use, be brought back to the service temperature (typically 23° C.) and be consumed quickly.

DISCLOSURE OF THE INVENTION

The present invention relates to a process involving the steps of disposing a metal oxide-containing film on an organic film, disposing a photoresist film thereon, and forming a resist pattern. An object of the present invention is to provide a metal oxide-containing film-forming composition in which (1) the metal oxide-containing film has a light-absorbing capability to allow for pattern formation even under high-NA exposure conditions, (2) the metal oxide-containing film serves as a satisfactory dry etching mask between the overlying layer or photoresist film and the underlying layer or organic film, and (3) the composition is fully shelf stable. Another object is to provide a metal oxide-containing film formed from the composition, a substrate having the metal oxide-containing film disposed thereon, and a patterning method.

Making investigations on the lithographic properties and stability of a metal oxide-containing intermediate film-forming composition, the inventors have found that a composition is obtained by combining (A) a metal oxide-containing compound obtained through hydrolytic condensation between a hydrolyzable silicon compound and a hydrolyzable metal compound with components (B), (C), and (D) defined below; and that (1) a metal oxide-containing film formed from the composition holds down reflection under high-NA exposure conditions of either dry or immersion lithography technique when light-absorbing groups are incorporated in the metal oxide-containing compounds, (2) the metal oxide-containing film has a sufficient etching selectivity ratio to serve as a dry etching mask, and (3) the composition is fully shelf stable so that its lithography performance undergoes little or no change over time.

In a first aspect, the invention provides a heat curable metal oxide-containing film-forming composition comprising (A) a metal oxide-containing compound obtained through hydrolytic condensation between one or multiple hydrolyzable silicon compounds having the general formula (1) and one or multiple hydrolyzable metal compounds having the general formula (2):

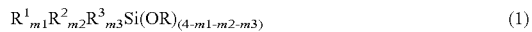

$$R^1_{m1}R^2_{m2}R^3_{m3}Si(OR)_{(4-m1-m2-m3)} \quad (1)$$

wherein R is an alkyl of 1 to 6 carbon atoms, $R^1$, $R^2$ and $R^3$ each are hydrogen or a monovalent organic group of 1 to 30 carbon atoms, m1, m2 and m3 each are 0 or 1, and m1+m2+m3 is an integer of 0 to 3,

$$U(OR^4)_{m4}(OR^5)_{m5} \quad (2)$$

wherein U is an element selected from Group III, IV and V elements in the Periodic Table, excluding silicon, $R^4$ and $R^5$ each are an organic group of 1 to 30 carbon atoms, m4 and m5 each are an integer inclusive of 0, and m4+m5 is equal to the valence of U, (B) at least one compound having the general formula (3) or (4):

$$L_aH_bX \quad (3)$$

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue,

$$M_aH_bA \quad (4)$$

wherein M is sulfonium, iodonium or ammonium, A is X or a non-nucleophilic counter ion, "a" and "b" are as defined above, and a+b is equal to the valence of hydroxyl group, organic acid residue or non-nucleophilic counter ion, (C) a mono or polyfunctional organic acid of 1 to 30 carbon atoms, and (D) an organic solvent.

In general, when a hydrolyzable silicon compound and a hydrolyzable metal compound (both being often referred to as "monomers") are contacted with water in the presence of a hydrolytic condensation catalyst, hydrolyzable substituent groups on the monomers undergo hydrolysis to form terminal reactive groups. The terminal reactive groups, in turn, undergo condensation reaction with other terminal reactive groups or unreacted hydrolyzable groups, to form —SiOSi—, —SiOU— or —UOU— bonds. This reaction occurs repeatedly and consecutively, forming a metal oxide-containing compound which is referred to as an oligomer or polymer or sometimes sol. At this point, among terminal reactive groups produced by hydrolytic reaction in the system and available from the monomers, oligomer or polymer, condensation reaction takes place from the highest reactivity groups consecutively to lower reactivity groups, whereupon terminal reactive groups belonging to the monomers, oligomer and polymer are consumed, and a metal oxide-containing compound forms instead. This condensation reaction proceeds infinitely and sometimes until the metal oxide-containing compound solution has eventually gelled. Often, silanol groups having relatively low reactivity are finally left as the terminal reactive groups.

However, the condensation reaction of terminal silanol groups is sometimes restrained at a specific pH, as reported in C. J. Brinker and G. W. Scherer, "Sol-Gel Science: The Physics and Chemistry of Sol-Gel Processing," Academic Press, San Diego (1990). It is described in J. Appl. Polym. Sci., Vol. 88, 636-640 (2003) that the reaction system is stabilized around pH 1.5, which pH is referred to as "stable pH," hereinafter.

It has been found that the composition is improved in shelf stability when it is controlled at a stable pH with component (C).

Prior art metal oxide-containing compounds are cured at elevated temperatures above 300° C. or with the aid of an acid catalyst derived from a thermal acid generator. According to the invention, when the composition is coated and heat cured, component (B) included therein acts to alter the pH in proximity to terminal silanol groups from the stable pH region to an unstable pH region (approximately pH 3, see C. J. Brinker and G. W. Scherer, "Sol-Gel Science: The Physics and Chemistry of Sol-Gel Processing," Academic Press, San Diego (1990)), so that the metal oxide-containing film can be effectively cured. If heat cured under the same conditions as the prior art temperature conditions, the composition forms a film having an advanced degree of crosslinking as compared with the prior art cured films. The migration of effective ingredients in the resist film to the metal oxide-containing film is thus prevented, and lithographic properties equivalent to ordinary organic ARC are available.

A technical combination of pH control, stabilizer and crosslinking catalyst in the above-mentioned way provides a composition which remains stable at room temperature and becomes effectively curable at elevated temperature. The composition can form a metal oxide-containing antireflective coating which has stability equivalent to conventional organic ARCs.

In a preferred embodiment, the composition may further comprise (E) a silicon-containing compound obtained through hydrolytic condensation of one or multiple hydrolyzable silicon compounds having the general formula (5):

$$R^6{}_{m6}R^7{}_{m7}R^8{}_{m8}Si(OR^9)_{(4-m6-m7-m8)} \quad (5)$$

wherein $R^9$ is an alkyl of 1 to 6 carbon atoms, $R^6$, $R^7$ and $R^8$ each are hydrogen or a monovalent organic group of 1 to 30 carbon atoms, m6, m7 and m8 each are 0 or 1, and m6+m7+m8 is an integer of 0 to 3.

The inclusion of a silicon-containing compound obtained through hydrolytic condensation of a silicon-containing monomer suggests a possible combination of properties of the metal oxide-containing compound with properties of the silicon-containing compound. There is obtained a metal oxide-containing ARC-forming composition having surpassing properties over the prior art organic ARCS.

In a preferred embodiment, the metal oxide-containing compound (A) is obtained through hydrolytic condensation between the compounds having the general formulae (1) and (2) in the presence of an acid catalyst. Use of an acid as the catalyst for hydrolytic condensation of monomers leads to a metal oxide-containing ARC-forming composition which is shelf stable and has lithographic properties equivalent to those of conventional organic ARCs.

Typically the acid catalyst comprises at least one compound selected from mineral acids and sulfonic acid derivatives. Use of a mineral acid or sulfonic acid derivative as the catalyst for hydrolytic condensation of monomers leads to a metal oxide-containing ARC-forming composition which is shelf stable and has lithographic properties equivalent to those of conventional organic ARCs.

In a preferred embodiment, the metal oxide-containing compound (A) comprises a metal oxide-containing compound obtained by effecting hydrolytic condensation between the compounds having formulae (1) and (2) in the presence of an acid catalyst to form a reaction mixture containing the metal oxide-containing compound, and substantially removing the acid catalyst from the reaction mixture.

The metal oxide-containing compounds prepared in the prior art are used in coating film-forming compositions without substantially removing the acid catalysts used in hydrolytic condensation. Due to the carry-over of the condensation reaction catalysts, the compositions fail to restrain condensation of silanol even when they are controlled at a stable pH. The resultant compositions are shelf unstable.

It has been found that an outstanding improvement in shelf stability is achieved when a metal oxide-containing compound is obtained by effecting hydrolytic condensation in the presence of an optimum acid catalyst and substantially removing the acid catalyst from the reaction mixture, and component (C) is combined therewith.

In a preferred embodiment, U in formula (2) is selected from among boron, aluminum, gallium, yttrium, germanium, titanium, zirconium, hafnium, bismuth, tin, phosphorus, vanadium, arsenic, antimony, niobium, and tantalum. A metal oxide-containing film comprising a metal represented by U has a high etching rate, as compared with a silicon-containing film free of such a metal. That is, an intermediate film capable of pattern transfer even when a photoresist film having a reduced thickness is used as the etching mask can be formed.

In a preferred embodiment, the compound of formula (1) is used in a greater molar amount than the compound of formula (2) during hydrolytic condensation, that is, (1)>(2). The presence of more silicon than the metal represented by U in the intermediate layer provides a sufficient etching selectivity when the underlying layer is etched using the intermediate layer as an etching mask. That is, an intermediate film capable of pattern transfer to the underlying layer can be formed.

In a preferred embodiment, M in formula (4) is tertiary sulfonium, secondary iodonium, or quaternary ammonium. When a composition comprising a compound of formula (4) as component (B) is used, a film having an advanced degree of crosslinking can be formed following curing. This prevents migration of effective ingredients in the resist film to the metal oxide-containing film, and achieves lithographic properties equivalent to conventional organic ARCs.

In a preferred embodiment, M in formula (4) is photo-degradable. If component (B) does not completely volatilize off during heat curing, part of component (B) can be left in the metal oxide-containing film. This component can adversely affect the profile of resist pattern. If component (B) used is such a compound that the cation moiety is degraded during exposure, it becomes possible to prevent the profile of resist pattern from being adversely affected during exposure. While the cure ability of the metal oxide-containing compound is drastically improved, a metal oxide-containing cured film having a good lithographic profile can be provided.

The preferred metal oxide-containing film-forming composition may further comprise water. When water is added to the composition, terminal silanol groups in the metal oxide-containing compounds are activated so that a denser film results from heat curing reaction. Such a dense film allows the overlying photoresist layer to exert lithographic performance equivalent to conventional organic ARCs.

The metal oxide-containing film-forming composition may further comprise a photoacid generator. If component (B) does not completely volatilize off during heat curing and/or exposure, part of component (B) can be left in the metal oxide-containing film, which can adversely affect the profile of resist pattern. If an acid is generated in the metal oxide-containing film during resist pattern formation, it prevents the profile of resist pattern from being adversely affected.

In a preferred embodiment, the composition may further comprise a mono or polyhydric alcohol substituted with a cyclic ether. Making further investigations on the metal oxide-containing compound to inhibit condensation between terminal silanol groups therein near room temperature, the inventors have found that a mono or polyhydric alcohol substituted with a cyclic ether is effective as a stabilizer for inhibiting condensation near room temperature whereby the composition is outstandingly improved in shelf stability.

In a second aspect, the invention provides a metal oxide-containing film for use in a multilayer resist process involving the steps of forming an organic film on a processable substrate, forming a metal oxide-containing film thereon, further forming a resist film thereon from a silicon-free chemically amplified resist composition, patterning the resist film, patterning the metal oxide-containing film using the resist film pattern, patterning the underlying organic film with the metal oxide-containing film pattern serving as an etching mask, and etching the processable substrate with the patterned organic film serving as an etching mask, the metal oxide-containing film being formed from the composition defined above.

Preferably, the metal oxide-containing film formed from the composition is used in the multilayer resist process wherein the process further involves the step of disposing an organic antireflective coating between the resist film and the metal oxide-containing film.

In a third aspect, the invention provides a substrate having formed thereon, in sequence, an organic film, a metal oxide-containing film of the composition defined above, and a photoresist film. Preferably, the substrate further has an organic antireflective coating between the metal oxide-containing film and the photoresist film. Preferably, the organic film is a film having an aromatic framework.

In a fourth aspect, the invention provides a method for forming a pattern in a substrate, comprising the steps of providing the substrate of the third aspect, exposing a pattern circuit region of the photoresist film to radiation, developing the photoresist film with a developer to form a resist pattern, dry etching the metal oxide-containing film with the resist pattern made an etching mask, etching the organic film with the patterned metal oxide-containing film made an etching mask, and etching the substrate with the patterned organic film made an etching mask, for forming a pattern in the substrate.

In a fifth aspect, the invention provides a method for forming a pattern in a substrate, comprising the steps of providing the substrate of the third aspect further having an organic antireflective coating, exposing a pattern circuit region of the photoresist film to radiation, developing the photoresist film with a developer to form a resist pattern, dry etching the antireflective coating and the metal oxide-containing film with the resist pattern made an etching mask, etching the organic film with the patterned metal oxide-containing film made an etching mask, and etching the substrate with the patterned organic film made an etching mask, for forming a pattern in the substrate.

Preferably, the organic film is a film having an aromatic framework. Typically, the exposing step is carried out by photolithography using radiation having a wavelength equal to or less than 300 nm. When the intermediate film and the substrate are used and the substrate is patterned by lithography, a microscopic pattern can be formed in the substrate at a high accuracy. When an organic film having an aromatic framework is used, it not only exerts an antireflection effect in the lithography step, but also has sufficient etching resistance in the substrate etching step, allowing for etch processing. Particularly when patterning is carried out by lithography using radiation with wavelength equal to or less than 300 nm, especially ArF excimer laser radiation, a microscopic pattern can be formed at a high accuracy.

BENEFITS OF THE INVENTION

The use of a metal oxide-containing intermediate film formed from the heat curable metal oxide-containing film-forming composition of the invention allows the overlying photoresist film to be patterned effectively. Since the metal oxide-containing intermediate film provides a high etching selectivity relative to an organic material, the formed photoresist pattern can be transferred in sequence to the metal oxide-containing intermediate film and the organic undercoat film by a dry etching process. While the advancement of the semiconductor process toward finer feature size entails a thickness reduction of photoresist film which interferes with pattern transfer to a conventional silicon-containing intermediate film, the heat curable metal oxide-containing film-forming composition of the invention allows a photoresist film with reduced thickness to be used as the etching mask, so that the photoresist pattern can be transferred to the substrate at a high accuracy. The composition is effective in minimizing the occurrence of pattern defects after lithography and is shelf stable.

DESCRIPTION OF THE PREFERRED EMBODIMENTS

In the specification, the singular forms "a," "an" and "the" include plural referents unless the context clearly dictates otherwise.

The notation (Cn-Cm) means a group containing from n to m carbon atoms per group.

The terms "mono or polyfunctional" and "mono or polyhydric" are used in a similar meaning. For example, the "mono or polyfunctional" compound is a compound having a functionality of 1, 2 or more.

Component A

Component (A) in the heat curable metal oxide-containing film-forming composition of the invention is a metal oxide-containing compound obtained through hydrolytic condensation of monomers, specifically a hydrolyzable silicon compound having the general formula (1) and a hydrolyzable metal compound having the general formula (2). The preferred method of preparing the metal oxide-containing compound is exemplified below, but not limited thereto.

One starting monomer is a hydrolyzable silicon compound having the general formula (1):

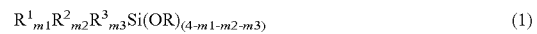

$$R^1_{m1}R^2_{m2}R^3_{m3}Si(OR)_{(4-m1-m2-m3)} \quad (1)$$

wherein R is an alkyl group of 1 to 6 carbon atoms, especially 1 to 3 carbon atoms, $R^1$, $R^2$ and $R^3$ each are hydrogen or a monovalent organic group of 1 to 30 carbon atoms, m1, m2 and m3 each are equal to 0 or 1, and m1+m2+m3 is equal to an integer of 0 to 3, and preferably 0 or 1.

As used herein, the term "organic group" refers to a group containing carbon, specifically carbon and hydrogen, and optionally nitrogen, oxygen, sulfur, silicon and other elements. The organic groups represented by $R^1$, $R^2$ and $R^3$ include unsubstituted monovalent hydrocarbon groups, such as straight, branched or cyclic alkyl, alkenyl, alkynyl, aryl and aralkyl groups, substituted forms of the foregoing hydrocarbon groups in which one or more hydrogen atoms are substituted by epoxy, alkoxy, hydroxyl or the like, groups of the general formula (6), shown later, for example, groups which are separated by such a moiety as —O—, —CO—, —OCO—, —COO—, or —OCOO—, and organic groups containing a silicon-silicon bond.

Preferred examples of $R^1$, $R^2$ and $R^3$ in the monomers of formula (1) include hydrogen, alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl, and cyclohexyl, alkenyl groups such as vinyl and allyl, alkynyl groups such as ethynyl, and light-absorbing groups like aryl groups such as phenyl and tolyl, and aralkyl groups such as benzyl and phenethyl.

Examples of suitable tetraalkoxysilanes corresponding to formula (1) wherein m1=0, m2=0 and m3=0 include tetramethoxysilane, tetraethoxysilane, tetra-n-propoxysilane, and tetra-iso-propoxysilane. Of these, preferred are tetramethoxysilane and tetraethoxysilane.

Examples of suitable trialkoxysilanes corresponding to formula (1) wherein m1=1, m2=0 and m3=0 include trimethoxysilane, triethoxysilane, tri-n-propoxysilane, triisopropoxysilane, methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, isopropyltrimethoxysilane, isopropyltriethoxysilane, isopropyltri-n-propoxysilane, isopropyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane,-cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltriisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane, adamantyltriisopropoxysilane, etc. Suitable light-absorbing monomers include phenyltrimethoxysilane, phenyltriethoxysilane, phenyltri-n-propoxysilane, phenyltriesopropoxysilane, benzyltrimethoxysilane, benzyltriethoxysilane, benzyltri-n-propoxysilane, benzyltriisopropoxysilane, tolyltrimethoxysilane, tolyltriethoxysilane, tolyltri-n-propoxysilane, tolyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane, naphthyltriisopropoxysilane, etc.

Of these, preferred are methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, and phenethyltriethoxysilane.

Examples of suitable dialkoxysilanes corresponding to formula (1) wherein m1=1, m2=1 and m3=0 include dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyldi-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, di-sec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane, bisadamantyldiisopropoxysilane, etc. Suitable light-absorbing monomers include diphenyldimethoxysilane, diphenyldiethoxysilane, methylphenyldimethoxysilane, methylphenyldiethoxysilane, diphenyldi-n-propoxysilane, and diphenyldiisopropoxysilane.

Of these, preferred are dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane, and methylphenyldiethoxysilane.

Examples of suitable monoalkoxysilanes corresponding to formula (1) wherein m1=1, m2=1 and m3=1 include trimethylmethoxysilane, trimethylethoxysilane, dimethylethylmethoxysilane, and dimethylethylethoxysilane. Suitable light-absorbing monomers include dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Of these, preferred are trimethylmethoxysilane, dimethylethylmethoxysilane, dimethylphenylmethoxysilane, dimethylbenzylmethoxysilane, and dimethylphenethylmethoxysilane.

Other exemplary organic groups represented by $R^1$, $R^2$ and $R^3$ include organic groups having at least one carbon-oxygen single bond or carbon-oxygen double bond. Illustrative of such groups are organic groups having at least one group selected from among epoxy, ester, alkoxy, and hydroxyl groups. Examples of organic groups having at least one carbon-oxygen single bond or carbon-oxygen double bond in formula (1) include those of the following general formula (6).

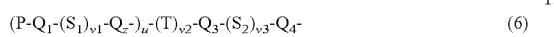

Herein, P is a hydrogen atom, hydroxyl group, epoxy ring of the formula:

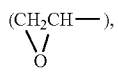

$C_1$-$C_4$ alkoxy group, $C_1$-$C_6$ alkylcarbonyloxy group, or $C_1$-$C_6$ alkylcarbonyl group; $Q_1$, $Q_2$, $Q_3$ and $Q_4$ are each independently —$C_qH_{(2q-p)}P_p$— wherein P is as defined above, p is an integer of 0 to 3, and q is an integer of 0 to 10 (with the proviso that q=0 denotes a single bond); u is an integer of 0 to 3, $S_1$ and $S_2$ are each independently —O—, —CO—, —OCO—, —COO—, or —OCOO—; v1, v2 and v3 are each independently 0 or 1. T is a divalent group of aliphatic or aromatic ring which may contain a heteroatom, typically oxygen, examples of which are shown below. Notably, the sites on T where T is bonded to $Q_2$ and $Q_3$ are not particularly limited and may be selected appropriate in accordance with reactivity dependent on steric factors and the availability of commercial reagents used in the reaction.

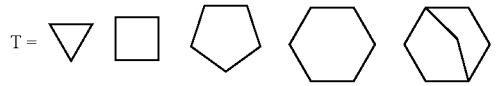
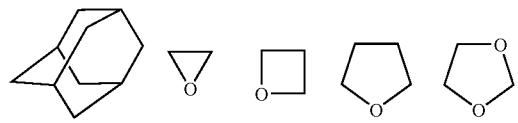
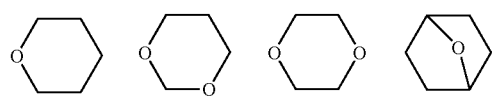
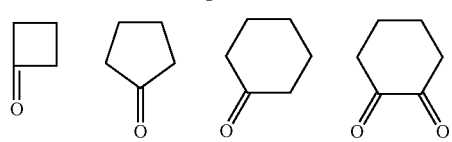
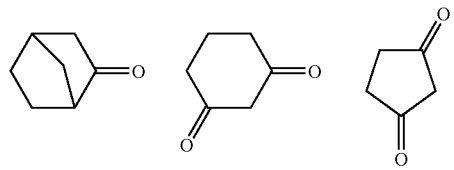

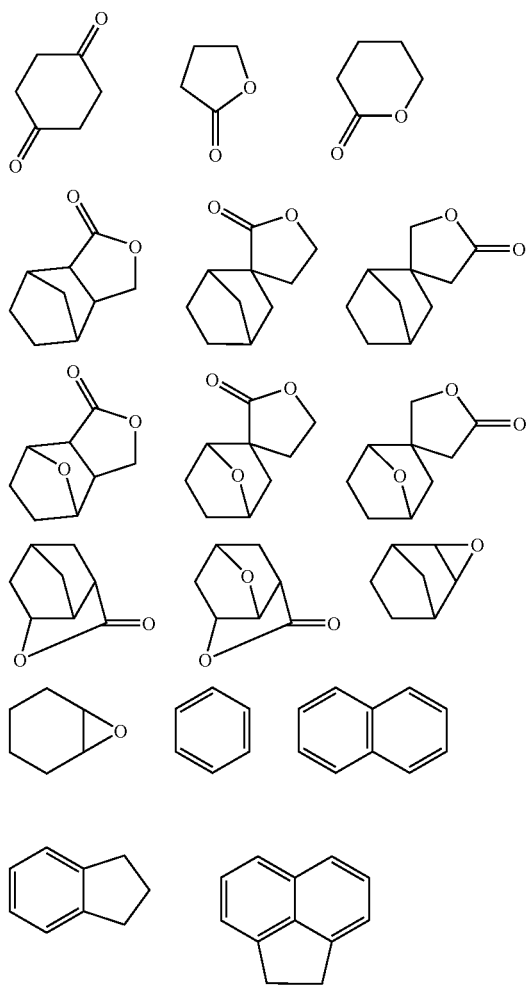

Preferred examples of organic groups having at least one carbon-oxygen single bond or carbon-oxygen double bond in formula (6) are given below. It is noted that in the following formulae, (Si) is depicted to indicate the bonding site to silicon.

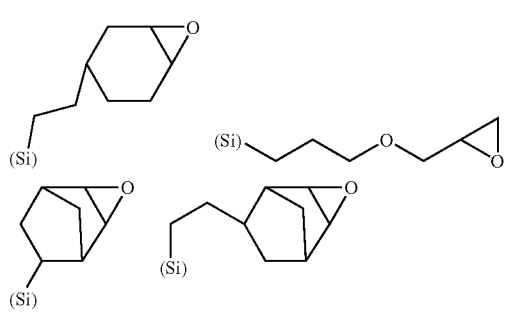

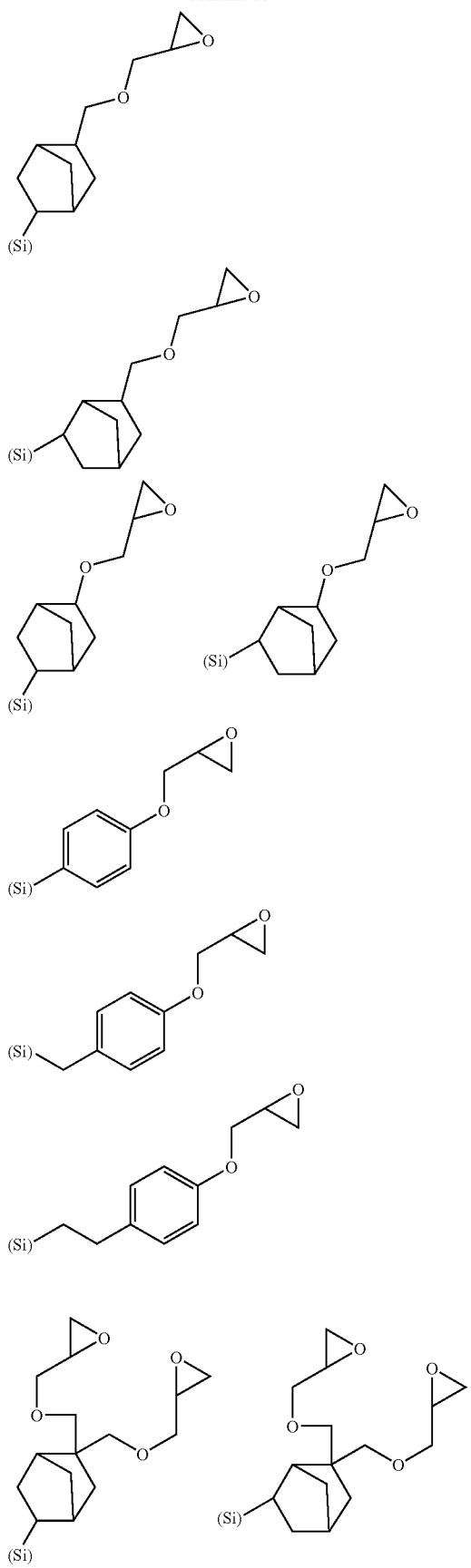
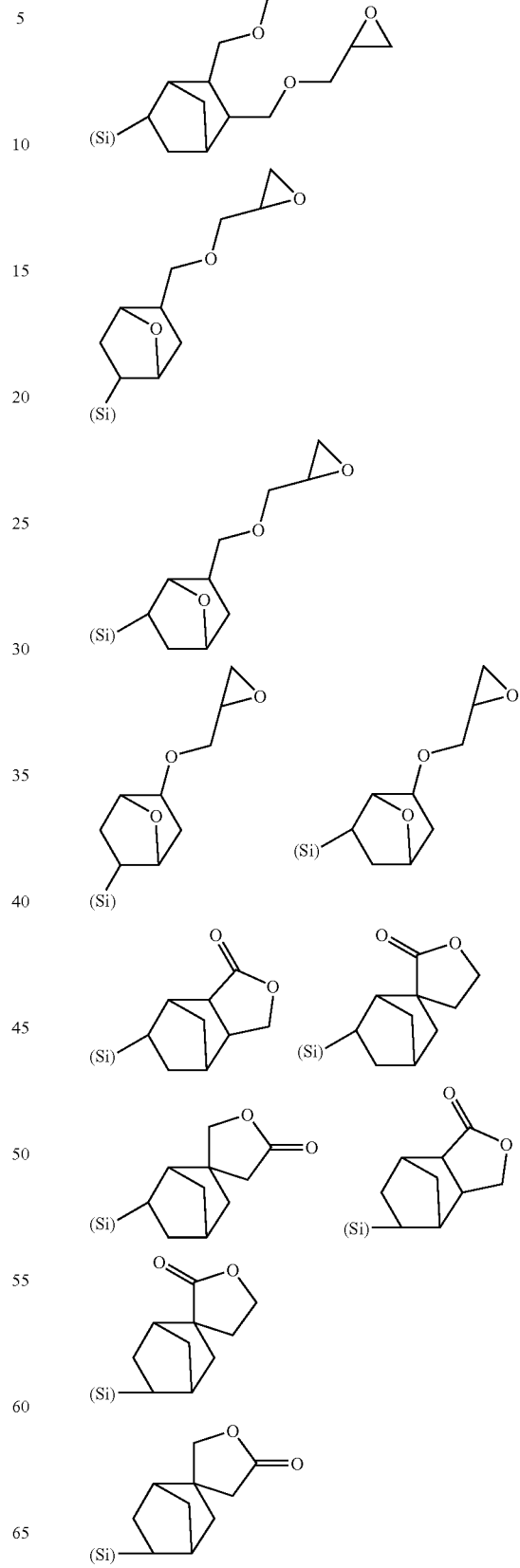

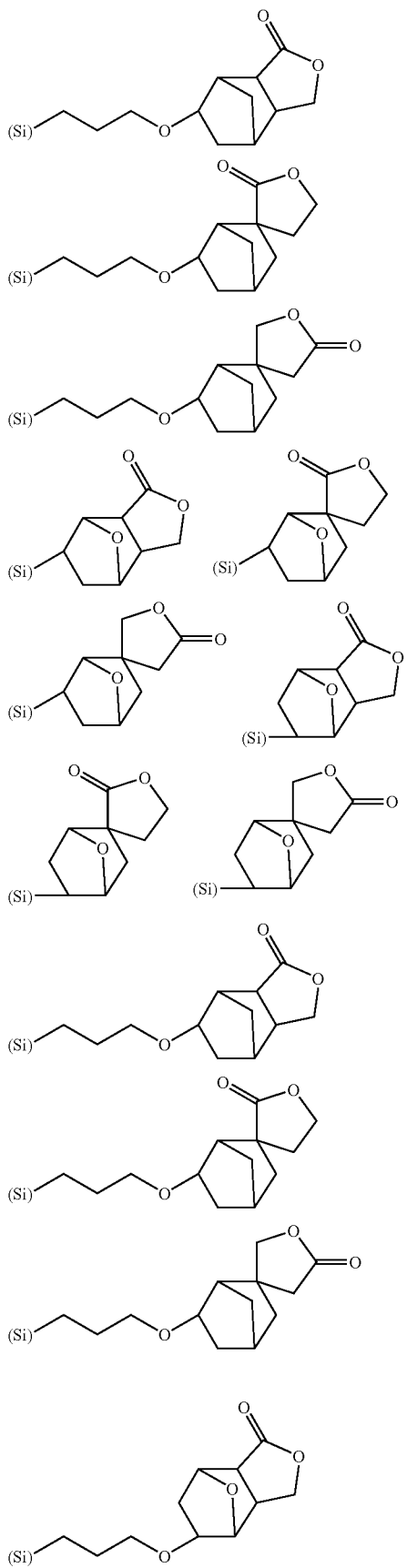
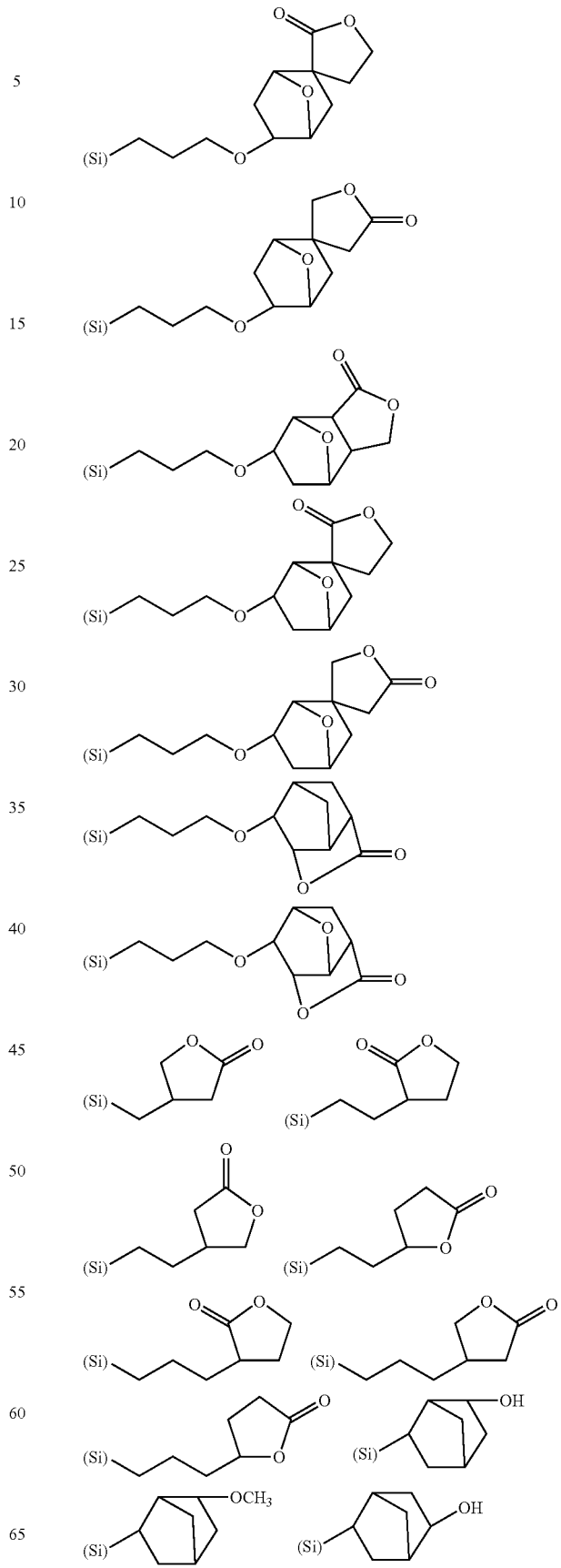

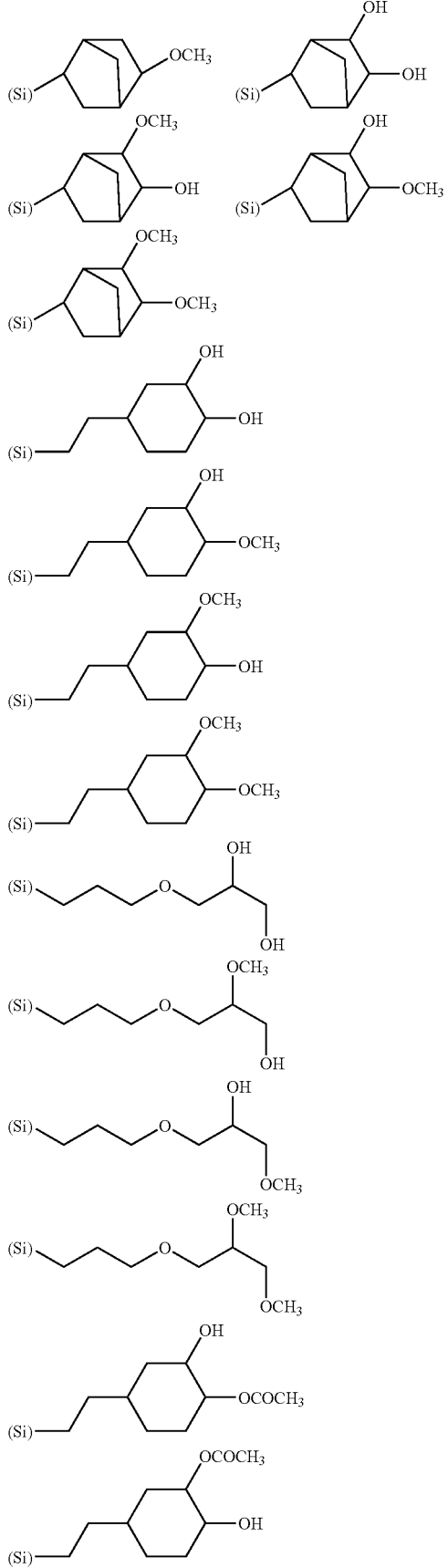
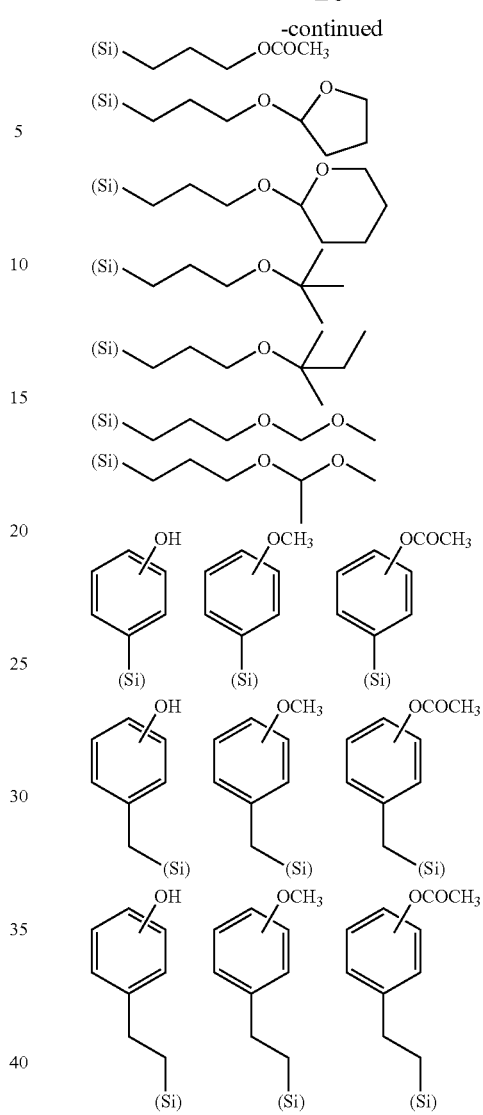
Also included in the organic groups of $R^1$, $R^2$ and $R^3$ are organic groups having a silicon-silicon bond, examples of which are given below.
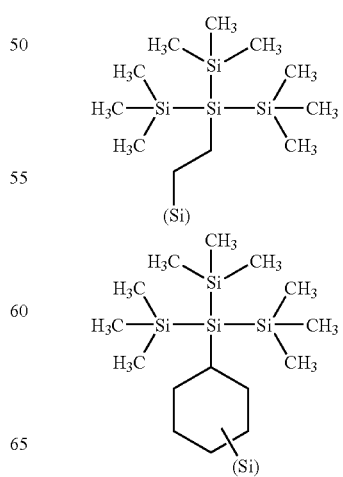

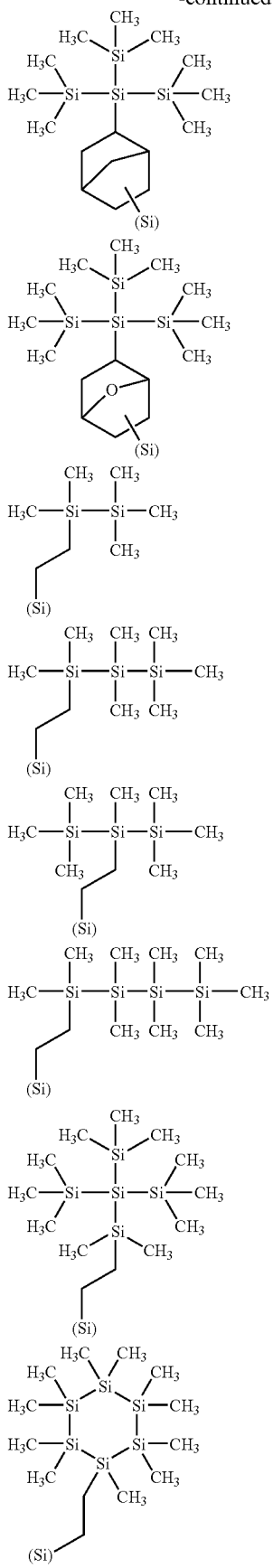

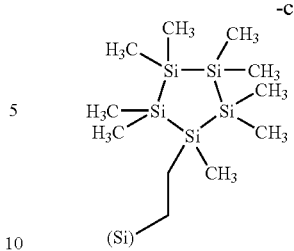

The other starting monomer is a hydrolyzable metal compound having the general formula (2):

$$U(OR^4)_{m4}(OR^5)_{m5} \quad (2)$$

wherein U is an element selected from Group III, IV and V elements in the Periodic Table, excluding silicon, $R^4$ and $R^5$ each are an organic group of 1 to 30 carbon atoms, m4 and m5 each are an integer inclusive of 0, and m4+m5 is equal to the valence of U.

As used herein, the term "organic group" refers to a group containing carbon, specifically carbon and hydrogen, and optionally nitrogen, oxygen, sulfur, silicon and other elements. The organic groups represented by $R^4$ and $R^5$ include unsubstituted monovalent hydrocarbon groups, such as straight, branched or cyclic alkyl, alkenyl, alkynyl, aryl and aralkyl groups, substituted forms of the foregoing hydrocarbon groups in which one or more hydrogen atoms are substituted by epoxy, alkoxy, hydroxyl or the like, and groups which are separated by such a moiety as —O—, —CO—, —OCO—, —COO—, or —OCOO—.

Examples of suitable compounds corresponding to formula (2) wherein U is boron include such monomers as boron methoxide, boron ethoxide, boron propoxide, boron butoxide, boron amyloxide, boron hexyloxide, boron cyclopentoxide, boron cyclohexyloxide, boron allyloxide, boron phenoxide, and boron methoxyethoxide.

Examples of suitable compounds corresponding to formula (2) wherein U is aluminum include such monomers as aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethylacetoacetate, aluminum dibutoxyethylacetoacetate, aluminum propoxybisethylacetoacetate, aluminum butoxybisethylacetoacetate, aluminum 2,4-pentanedionate, and aluminum 2,2,6,6-tetramethyl-3,5-heptanedionate.

Examples of suitable compounds corresponding to formula (2) wherein U is gallium include such monomers as gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethylacetoacetate, gallium dibutoxyethylacetoacetate, gallium propoxybisethylacetoacetate, gallium butoxybisethylacetoacetate, gallium 2,4-pentanedionate, and gallium 2,2,6,6-tetramethyl-3,5-heptanedionate.

Examples of suitable compounds corresponding to formula (2) wherein U is yttrium include such monomers as yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethylacetoacetate, yttrium dibutoxyethylacetoacetate, yttrium propoxybisethylacetoacetate, yttrium butoxybisethylacetoacetate, yttrium 2,4-pentanedionate, and yttrium 2,2,6,6-tetramethyl-3,5-heptanedionate.

Examples of suitable compounds corresponding to formula (2) wherein U is germanium include such monomers as germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

Examples of suitable compounds corresponding to formula (2) wherein U is titanium include such monomers as titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxyethylacetoacetate, titanium dibutoxyethylacetoacetate, titanium dipropoxide bis(2,4-pantandionate), titanium dibutoxide bis(2,4-pentanedionate).

Examples of suitable compounds corresponding to formula (2) wherein U is hafnium include such monomers as hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxybisethylacetoacetate, hafnium dibutoxybisethylacetoacetate, hafnium dipropoxide bis(2,4-pentanedionate), and hafnium dibutoxide bis(2,4-pentanedionate).

Examples of suitable compounds corresponding to formula (2) wherein U is tin include such monomers as tin methoxide, tin ethoxide, tin propoxide, tin butoxide, tin phenoxide, tin methoxyethoxide, tin ethoxyethoxide, tin 2,4-pentanedionate, and tin 2,2,6,6-tetramethyl-3,5-heptanedionate.

Examples of suitable compounds corresponding to formula (2) wherein U is arsenic include such monomers as arsenic methoxide, arsenic ethoxide, arsenic propoxide, arsenic butoxide, and arsenic phenoxide.

Examples of suitable compounds corresponding to formula (2) wherein U is antimony include such monomers as antimony methoxide, antimony ethoxide, antimony propoxide, antimony butoxide, antimony phenoxide, antimony acetate, and antimony propionate.

Examples of suitable compounds corresponding to formula (2) wherein U is niobium include such monomers as niobium methoxide, niobium ethoxide, niobium propoxide, niobium butoxide, and nioblum phenoxide.

Examples of suitable compounds corresponding to formula (2) wherein U is tantalum include such monomers as tantalum methoxide, tantalum ethoxide, tantalum propoxide, tantalum butoxide, and tantalum phenoxide.

Examples of suitable compounds corresponding to formula (2) wherein U is bismuth include such monomers as bismuth methoxide, bismuth ethoxide, bismuth propoxide, bismuth butoxide, and bismuth phenoxide.

Examples of suitable compounds corresponding to formula (2) wherein U is phosphorus include such monomers as trimethyl phosphite, triethyl phosphite, tripropyl phosphite, trimethyl phosphate, triethyl phosphate, and tripropyl phosphate.

Examples of suitable compounds corresponding to formula (2) wherein U is vanadium include such monomers as vanadium oxide bis(2,4-pentanedionate), vanadium 2,4-pentanedionate, vanadium oxytributoxide, and vanadium oxytripropoxide.

Examples of suitable compounds corresponding to formula (2) wherein U is zirconium include such monomers as zirconium methoxide, zirconium ethoxide, zirconium propoxide, zirconium butoxide, zirconium phenoxide, zirconium dibutoxide bis(2,4-pentanedionate), and zirconium dipropoxide bis(2,2,6,6-tetramethyl-3,5-heptane-dionate).

Examples of suitable compounds corresponding to formula (2) wherein U is tantalum include such monomers as tantalum methoxide, tantalum ethoxide, tantalum propoxide, tantalum butoxide, and tantalum phenoxide.

By selecting one or multiple monomers from the monomers having formula (1) and one or multiple monomers from the monomers having formula (2) and combining them before or during the reaction, there is provided a system of reactants from which the desired metal oxide-containing compound is formed.

The metal oxide-containing compound may be prepared by subjecting selected monomers of formulae (1) and (2) to hydrolytic condensation in the presence of an acid catalyst which is selected from mineral acids, aliphatic and aromatic sulfonic acids and mixtures thereof. Suitable acid catalysts which can be used include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst may be used in an amount of $10^{-6}$ to 10 moles, preferably $10^{-5}$ to 5 moles, and more preferably $10^{-4}$ to 1 mole per mole of the monomers.

The amount of water used in hydrolytic condensation of the monomers to form the metal oxide-containing compound is preferably 0.01 to 100 moles, more preferably 0.05 to 50 moles, even more preferably 0.1 to 30 moles per mole of hydrolyzable substituent groups on the monomers. The addition of more than 100 moles of water is uneconomical in that the apparatus used for reaction becomes accordingly larger.

In one exemplary operating procedure, the monomers are added to an aqueous solution of the catalyst to start hydrolytic condensation. At this point, an organic solvent may be added to the aqueous catalyst solution and/or the lo monomers may be diluted with an organic solvent(s). The reaction temperature is 0 to 100° C., preferably 5 to 80° C. In the preferred procedure, the monomers are added dropwise at a temperature of 5 to 80° C., after which the reaction mixture is matured at 20 to 80° C.

Examples of the organic solvent which can be added to the aqueous catalyst solution or to the monomers for dilution include methanol, ethanol, 1-propanol, 2-propanol, 1-butanol, 2-butanol, 2-methyl-l-propanol, acetone, acetonitrile, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate (PGMEA), propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Among others, water-soluble solvents are preferred. Suitable water-soluble solvents include alcohols such as methanol, ethanol, 1-propanol and 2-propanol, polyhydric alcohols such as ethylene glycol and propylene glycol, polyhydric alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether, acetone, acetonitrile, and tetrahydrofuran. Of these, those solvents having a boiling point equal to or lower than 100° C. are preferred.

The amount of the organic solvent used is 0 to 1,000 ml, preferably 0 to 500 ml per mole of the monomers. Too much amounts of the organic solvent are uneconomical in that the reactor must be of larger volume.

Thereafter, neutralization reaction of the catalyst is carried out if necessary, and the alcohol produced by the hydrolytic condensation reaction is removed under reduced pressure, yielding an aqueous reaction mixture. The amount of an alkaline compound used for neutralizataion is preferably 0.1 to 2 equivalents relative to the acid used as the catalyst. Any alkaline compound may be used as long as it exhibits alkalinity in water.

Subsequently, the alcohol or byproducts associated with the hydrolytic condensation reaction are preferably removed from the reaction mixture. To this end, the reaction mixture is heated at a temperature which is preferably 0 to 100° C., more preferably 10 to 90° C., even more preferably 15 to 80° C., although the temperature depends on the type of organic solvent added and the type of alcohol produced. The reduced pressure is preferably atmospheric or subatmospheric, more preferably equal to or less than 80 kPa in absolute pressure, and even more preferably equal to or less than 50 kPa in absolute pressure, although the pressure varies with the type of organic solvent and alcohol to be removed and the vacuum pump, condenser, and heating temperature. Although an accurate determination of the amount of alcohol removed at this point is difficult, it is desired to remove about 80% by weight or more of the alcohol produced.

Next, the acid catalyst used in the hydrolytic condensation may be removed from the reaction mixture. This is achieved by mixing the metal oxide-containing compound with water and extracting the metal oxide-containing compound with an organic solvent. The organic solvent used herein is preferably a solvent in which the metal oxide-containing compound is dissolvable and which provides two-layer separation when mixed with water. Suitable organic solvents include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also acceptable to use a mixture of a water-soluble organic solvent and a substantially water-insoluble organic solvent. Exemplary mixtures include, but are not limited to, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone (MIK), ethanol+MIK, 1-propanol+MIK, 2-propanol+MIK, propylene glycol monomethyl ether+MIK, ethylene glycol monomethyl ether+MIK, propylene glycol monoethyl ether+MIK, ethylene glycol monoethyl ether+MIK, propylene glycol monopropyl ether+MIK, ethylene glycol monopropyl ether+MIK, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate (PGMEA), ethanol+PGMEA, 1-propanol+PGMEA, 2-propanol+PGMEA, propylene glycol monomethyl ether+PGMEA, ethylene glycol monomethyl ether+PGMEA, propylene glycol monoethyl ether+PGMEA, ethylene glycol monoethyl ether+PGMEA, propylene glycol monopropyl ether+PGMEA, and ethylene glycol monopropyl ether+PGMEA.

A mixing proportion of the water-soluble organic solvent and the substantially water-insoluble organic solvent may be determined as appropriate although it is a usual practice to use 0.1 to 1,000 parts, preferably 1 to 500 parts, and more preferably 2 to 100 parts by weight of the water-soluble organic solvent per 100 parts by weight of the substantially water-insoluble organic solvent.

Subsequent step is to wash with neutral water. The water used for washing may be deionized water or ultrapure water. The amount of water is 0.01 to 100 liters (L), preferably 0.05 to 50 L, more preferably 0.1 to 5 L per liter of the metal oxide-containing compound solution. The washing step may be carried out by feeding both the liquids into a common vessel, agitating the contents, allowing the mixture to stand and to separate into two layers, and removing the water layer. The number of washing steps may be one or more, although the repetition of more than 10 washing steps does not achieve the effect corresponding to such a number of steps. Preferably the number of washing steps is from 1 to about 5.

Other methods of removing the acid catalyst include the use of an ion-exchange resin, and neutralization with epoxy compounds such as ethylene oxide and propylene oxide followed by removal. A proper method may be selected from among these methods in accordance with the acid catalyst used in the reaction.

As used herein, the term "substantially removing the acid catalyst" means that it is acceptable that no more than 10% by weight, preferably no more than 5% by weight of the acid catalyst used in the reaction is left in the metal oxide-containing compound.

Since the water washing operation may sometimes achieve an effect substantially equivalent to a fractionation operation in that part of the metal oxide-containing compound is carried away to the water layer, the number of washing cycles and the amount of water may be determined appropriate depending on the relative extent of catalyst removal and fractionation effects.

A final solvent is added to the metal oxide-containing compound solution from which the acid catalyst may or may not have been removed, for inducing solvent exchange under a reduced pressure, yielding a silicon-containing compound solution. The temperature for solvent exchange is preferably 0 to 100° C., more preferably 10 to 90° C., even more preferably 15 to 80° C., although the temperature depends on the type of reaction or extraction solvent to be removed. The reduced pressure is preferably atmospheric or subatmospheric, more preferably equal to or less than 80 kPa in absolute pressure, and even more preferably equal to or less than 50 kPa in absolute pressure, although the pressure varies with the type of extraction solvent to be removed and the vacuum pump, condenser, and heating temperature.

As a result of solvent exchange, the metal oxide-containing compound sometimes becomes unstable. Such instability occurs depending on the compatibility of the metal oxide-containing compound with the final solvent. Component (C) to be described later may be added as a stabilizer in order to prevent such inconvenience. The amount of component (C) added is 0 to 25 parts, preferably 0 to 15 parts, more preferably 0 to 5 parts by weight per 100 parts by weight of the metal oxide-containing compound in the solution prior to the solvent exchange. When added, the preferred amount of component (C) is at least 0.5 part by weight. If necessary for the solution before the solvent exchange, component (C) may be added before the solvent exchange operation is carried out.

If the metal oxide-containing compound is concentrated above a certain level, it undergoes condensation reaction so that it converts to the state which can no longer be re-dissolved in organic solvents. It is then recommended that the metal oxide-containing compound be kept in solution form at an adequate concentration. Too low a concentration corresponds to an excessive volume of solvent which is uneconomical. A concentration of 0.1 to 20% by weight is preferable.

The final solvent added to the metal oxide-containing compound solution is preferably an alcoholic solvent, examples of which include monoalkyl ethers of ethylene glycol, diethylene glycol, triethylene glycol, propylene glycol, dipropylene glycol and the like. Preferred examples include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

In another exemplary reaction procedure, water or a water-containing organic solvent is added to the monomers or an organic solvent solution of the monomers to start hydrolytic reaction. At this point, the catalyst may be added to the monomers or an organic solvent solution of the monomers, or water or a water-containing organic solvent. The reaction temperature is 0 to 100° C., preferably 10 to 80° C. In the preferred procedure, water is added dropwise at a temperature of 10 to 50° C., after which the reaction mixture is matured at 20 to 80° C.

Of the organic solvents, if used, water-soluble solvents are preferred. Suitable organic solvents include methanol, ethanol, 1-propanol, 2-propanol, 1-butanol, 2-butanol, 2-methyl-1-propanol, acetone, tetrahydrofuran, acetonitrile, and polyhydric alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, and mixtures thereof.

The amount of the organic solvent used may be the same as described above for the one procedure. The resulting reaction mixture is post-treated as described above for the one procedure, yielding a metal oxide-containing compound.

The molecular weight of the resulting metal oxide-containing compound may be adjusted by a choice of monomers and by control of reaction conditions during polymerization. Compounds having a weight average molecular weight in excess of 100,000 may produce foreign matter or coating specks in some cases. Then the metal oxide-containing compound preferably has a weight average molecular weight equal to or less than 100,000, more preferably 200 to 50,000, and even more preferably 300 to 30,000. It is noted that the weight average molecular weight is determined by gel permeation chromatography (GPC) using an RI detector and polystyrene standards.

In the metal oxide-containing film-forming composition of the invention, two or more metal oxide-containing compounds which differ in composition and/or reaction conditions may be contained as long as they are prepared under acidic conditions.

According to the invention, a metal oxide-containing film-forming composition is formulated by combining (A) the metal oxide-containing compound defined above with (B) a thermal crosslink accelerator, (C) an acid, and (D) an organic solvent.

Component B

The composition of the invention must contain a thermal crosslink accelerator as component (B) to further accelerate crosslinking reaction in forming a metal oxide-containing film. Included in the accelerator are compounds having the general formulae (3) and (4).

$$L_a H_b X \quad (3)$$

Herein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue.

$$M_a H_b A \quad (4)$$

Herein M is sulfonium, iodonium or ammonium, preferably tertiary sulfonium, secondary iodonium, or quaternary ammonium, and more preferably a photo-degradable onium like triarylsulfonium or diaryliodonium. A is as defined above for X or a non-nucleophilic counter ion, "a" and "b" are as defined above, and a+b is equal to the valence of hydroxyl group, organic acid residue or non-nucleophilic counter ion.

Exemplary of the compound of formula (3) are alkali metal salts of organic acids, for example, salts of lithium, sodium, potassium, rubidium and cesium with hydroxide, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid and other monofunctional acids; and salts of lithium, sodium, potassium, rubidium and cesium with mono- or di-functional acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Illustrative examples include lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoroacetate, lithium monochloroacetate, lithium dichloroacetate, lithium trichloroacetate, lithium hydroxide, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate, lithium carbonate;

sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoroacetate, sodium monochloroacetate, sodium dichloroacetate, sodium trichloroacetate, sodium hydroxide, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, sodium carbonate;

potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoroacetate, potassium monochloroacetate, potassium dichloroacetate, potassium trichloroacetate, potassium hydroxide, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate, potassium carbonate, etc.

The compounds of formula (4) include sulonium, iodonium and ammonium compounds having the formulae (Q-1), (Q-2), and (Q-3), respectively.

(Q-1)

(Q-2)

(Q-3)

Herein, $R^{204}$, $R^{205}$ and $R^{206}$ are each independently a straight, branched or cyclic alkyl, alkenyl, oxoalkyl or oxoalkenyl group of 1 to 12 carbon atoms, substituted or unsubstituted aryl group of 6 to 20 carbon atoms, aralkyl or aryloxoalkyl group of 7 to 12 carbon atoms, in which some or all hydrogen atoms may be substituted by alkoxy groups or the like. A pair of $R^{205}$ and $R^{206}$ may form a ring with the sulfur atom to which they are attached, and each is a $C_1$-$C_6$ alkylene group when they form a ring. $A^-$ is a non-nucleophilic counter ion. $R^{207}$, $R^{208}$, $R^{209}$, and $R^{210}$ are as defined for $R^{204}$, $R^{205}$ and $R^{206}$, and may also be hydrogen. A pair of $R^{207}$ and $R^{208}$ or a combination of $R^{207}$, $R^{208}$ and $R^{209}$ may form a ring with the nitrogen atom to which they are attached, and each is a $C_3$-$C_{10}$ alkylene group when they form a ring.

$R^{204}$, $R^{205}$, $R^{206}$, $R^{207}$, $R^{208}$, $R^{209}$, and $R^{210}$ may be the same or different. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Suitable aryl groups include phenyl and naphthyl, alkoxyphenyl groups such as p-methoxyphenyl, m-methoxyphenyl, o-methoxyphenyl, ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, phenylethyl and phenethyl. Suitable aryloxoalkyl groups include 2-aryl-2-oxoethyl groups such as 2-phenyl-2-oxoethyl, 2-(1-naphthyl)-2-oxoethyl and 2-(2-naphthyl)-2-oxoethyl.

Examples of the non-nucleophilic counter ion represented by A⁻ include hydroxyl, formate, acetate, propionate, butanoate, pentanoate, hexanoate, heptanoate, octanoate, nonanoate, decanoate, oleate, stearate, linoleate, linolenate, benzoate, p-methylbenzoate, p-t-butylbenzoate, phthalate, isophthalate, terephthalate, salicylate, trifluoroacetate, monochloroacetate, dichloroacetate, trichloroacetate, fluoride, chloride, bromide, iodide, nitrate, chlorate, perchlorate, bromate, iodate, oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, and carbonate ions.

Specifically, suitable sulfonium compounds include triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride, triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodate, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate, and bistriphenylsulfonium carbonate.

Suitable iodonium compounds include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodate, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate, and bisdiphenyliodonium carbonate.

Suitable ammonium compounds include tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodate, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate; tetrapropylammonium formate, tetrapropylammonium acetate, tetrapropylammonium propionate, tetrapropylammonium butanoate, tetrapropylammonium pentanoate, tetrapropylammoniurn hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, bistetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methylsuccinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate; and tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate, and bistetrabutylammonium carbonate.

The thermal crosslink accelerators may be used alone or in admixture of two or more. An appropriate amount of the thermal crosslink accelerator added is 0.01 to 50 parts, more preferably 0.1 to 40 parts by weight per 100 parts by weight of the base polymer. As used herein, the "base polymer" refers to the metal oxide-containing compound (A) obtained by the above-described method.

Component C

A mono or polyfunctional organic acid of 1 to 30 carbon atoms must be added to the heat-curable metal oxide-containing film-forming composition as component (C) in order to keep the composition stable. Suitable organic acids include, but are not limited to, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Of these, oxalic acid, maleic acid, formic acid, acetic acid, propionic acid, and citric acid are preferred. A mixture of two or more acids may be used to maintain the stability.

The amount of the acid added is 0.001 to 25 parts, preferably 0.01 to 15 parts, and more preferably 0.1 to 5 parts by weight per 100 parts by weight of the metal oxide-containing compound in the composition. Alternatively, the organic acid is added in such amounts that the composition may be at a proper pH, preferably $0 \leq pH \leq 7$, more preferably $0.3 \leq pH \leq 6.5$, and even more preferably $0.5 \leq pH \leq 6$.

Component D

In the composition comprising the metal oxide-containing compound according to the invention, an organic solvent is present as component (D). It may be the same as used in the preparation of the metal oxide-containing compounds. Water-soluble organic solvents are preferred. Examples of the solvent used include monoalkyl ethers of ethylene glycol, diethylene glycol, triethylene glycol, propylene glycol, dipropylene glycol, butane diol, pentane diol, etc. The organic solvent is preferably selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether. The amount of the organic solvent used will be described later.

Component E

In a preferred embodiment, the composition may further comprise (E) a silicon-containing compound obtained through hydrolytic condensation of one or multiple hydrolyzable silicon compounds having the general formula (5):

$$R^6_{m6}R^7_{m7}R^8_{m8}Si(OR^9)_{(4-m6-m7-m8)} \quad (5)$$

wherein $R^9$ is an alkyl group of 1 to 6 carbon atoms, $R^6$, $R^7$ and $R^8$ each are hydrogen or a monovalent organic group of 1 to 30 carbon atoms, m6, m7 and m8 each are 0 or 1, and m6+m7+m8 is an integer of 0 to 3.

$R^6$, $R^7$, $R^8$, $R^9$, m6, m7, and m8 in formula (5) correspond to $R^1$, $R^2$, $R^3$, R, m1, m2, and m3 in formula (1), and include the same examples.

The silicon-containing compound (E) may be prepared by the same method as component (A).

Alternatively, the silicon-containing compound (E) may be prepared through hydrolytic condensation of a monomer in the presence of a base catalyst. The preferred method of preparing the silicon-containing compound is exemplified below, but not limited thereto.

The starting material or monomer may be of formula (5) which has been generally described and specifically illustrated above.

The silicon-containing compound may be prepared by subjecting a suitable monomer(s) to hydrolytic condensation in the presence of a basic catalyst.

Suitable basic catalysts which can be used herein include, but are not limited to, methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The catalyst may be used in an amount of $10^{-6}$ to 10 moles, preferably $10^{-5}$ to 5 moles, and more preferably $10^{-4}$ to 1 mole per mole of the silicon monomer(s).

The amount of water used in hydrolytic condensation of the monomer(s) to form the silicon-containing compound is preferably 0.1 to 50 moles per mole of hydrolyzable substituent group(s) on the monomer(s). The addition of more than 50 moles of water is uneconomical in that the apparatus used for reaction becomes accordingly larger.

In one exemplary operating procedure, the monomer is added to an aqueous solution of the catalyst to start hydrolytic condensation. At this point, an organic solvent may be added to the aqueous catalyst solution and/or the monomer may be diluted with an organic solvent. The reaction temperature is 0 to 100° C., preferably 5 to 80° C. In the preferred procedure, the monomer is added dropwise at a temperature of 5 to 80° C., after which the reaction mixture is matured at 20 to 80° C.

Examples of the organic solvent which can be added to the aqueous catalyst solution or to the monomer for dilution include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate (PGMEA), propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Among others, water-soluble solvents are preferred. Suitable water-soluble solvents include alcohols such as methanol, ethanol, 1-propanol and 2-propanol, polyhydric alcohols such as ethylene glycol and propylene glycol, polyhydric alcohol condensation derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile, and tetrahydrofuran. Of these, those solvents having a boiling point equal to or lower than 100° C. are preferred.

The amount of the organic solvent used is preferably 0 to 1,000 ml per mole of the monomer. Too much amounts of the organic solvent are uneconomical in that the reactor must be of larger volume.

Thereafter, neutralization reaction of the catalyst is carried out if necessary, and the alcohol produced by the hydrolytic condensation reaction is removed under reduced pressure, yielding an aqueous reaction mixture. The amount of an acidic compound used for neutralizataion is preferably 0.1 to 2 equivalents relative to the base used as the catalyst. Any acidic compound may be used as long as it exhibits acidity in water.

Subsequently, the alcohol produced by the hydrolytic condensation reaction must be removed from the reaction mixture. To this end, the reaction mixture is heated at a temperature which is preferably 0 to 100° C., more preferably 10 to 90° C., even more preferably 15 to 80° C., although the temperature depends on the type of organic solvent added and the type of alcohol produced. The reduced pressure is preferably atmospheric or subatmospheric, more preferably equal to or less than 80 kPa in absolute pressure, and even more preferably equal to or less than 50 kPa in absolute pressure, although the pressure varies with the type of organic solvent and alcohol to be removed and the vacuum pump, condenser, and heating temperature. Although an accurate determination of the amount of alcohol removed at this point is difficult, it is desired to remove about 80% by weight or more of the alcohol produced.

Next, the basic catalyst used in the hydrolytic condensation is removed from the reaction mixture. This is achieved by extracting the silicon-containing compound with an organic solvent. The organic solvent used herein is preferably a solvent in which the silicon-containing compound is dissolvable and which provides two-layer separation when mixed with water. Suitable organic solvents include methanol, ethanol, 1-propanol, 2-propanol, 1-butanol, 2-butanol, 2-methyl-1- propanol, acetone, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also acceptable to use a mixture of a water-soluble organic solvent and a substantially water-insoluble organic solvent. Exemplary mixtures include, but are not limited to, combinations of methanol+ethyl acetate, ethanol+ethyl acetate, 1-propanol+ethyl acetate, 2-propanol+ethyl acetate, propylene glycol monomethyl ether+ethyl acetate, ethylene glycol monomethyl ether+ethyl acetate, propylene glycol monoethyl ether+ethyl acetate, ethylene glycol monoethyl ether+ethyl acetate, propylene glycol monopropyl ether+ethyl acetate, ethylene glycol monopropyl ether+ethyl acetate, methanol+methyl isobutyl ketone (MIK), ethanol+MIK, 1-propanol+MIK, 2-propanol+MIK, propylene glycol monomethyl ether+MIK, ethylene glycol monomethyl ether+MIK, propylene glycol monoethyl ether+MIK, ethylene glycol monoethyl ether+MIK, propylene glycol monopropyl ether+MIK, ethylene glycol monopropyl ether+MIK, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate (PGMEA), ethanol+PGMEA, 1-propanol+PGMEA, 2-propanol+PGMEA, propylene glycol monomethyl ether+PGMEA, ethylene glycol monomethyl ether+PGMEA, propylene glycol monoethyl ether+PGMEA, ethylene glycol monoethyl ether+PGMEA, propylene glycol monopropyl ether+PGMEA, and ethylene glycol monopropyl ether+PGMEA.

A mixing proportion of the water-soluble organic solvent and the substantially water-insoluble organic solvent may be determined as appropriate although it is a usual practice to use 0.1 to 1,000 parts, preferably 1 to 500 parts, and more preferably 2 to 100 parts by weight of the water-soluble organic solvent per 100 parts by weight of the substantially water-insoluble organic solvent.

Subsequent step is to wash with neutral water. The water used for washing may be deionized water or ultrapure water. The amount of water is 0.01 to 100 liters (L), preferably 0.05 to 50 L, more preferably 0.1 to 5 L per liter of the silicon-containing compound solution. The washing step may be carried out by feeding both the liquids into a common vessel, agitating the contents, allowing the mixture to stand and to separate into two layers, and removing the water layer. The number of washing steps may be one or more, although the repetition of more than 10 washing steps does not achieve the effect corresponding to such a number of steps. Preferably the number of washing steps is from 1 to about 5.

A final solvent is added to the silicon-containing compound solution from which the basic catalyst has been removed, for inducing solvent exchange under a reduced pressure, yielding a silicon-containing compound solution. The temperature for solvent exchange is preferably 0 to 100° C., more preferably 10 to 90° C., even more preferably 15 to 80° C., although the temperature depends on the type of extraction solvent to be removed. The reduced pressure is preferably atmospheric or subatmospheric, more preferably equal to or less than 80 kPa in absolute pressure, and even more preferably equal to or less than 50 kPa in absolute pressure, although the pressure varies with the type of extraction solvent to be removed and the vacuum pump, condenser, and heating temperature.

The final solvent added to the silicon-containing compound solution is preferably an alcoholic solvent, examples of which include monoalkyl ethers of ethylene glycol, diethylene glycol, triethylene glycol, propylene glycol, dipropylene glycol, butane diol and the like. Preferred examples include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

In another exemplary reaction procedure, water or a water-containing organic solvent is added to the monomer or an organic solvent solution of the monomer to start hydrolytic reaction. At this point, the catalyst may be added to the monomer or an organic solvent solution of the monomer, or water or a water-containing organic solvent. The reaction temperature is 0 to 100° C., preferably 10 to 80° C. In the preferred procedure, water is added dropwise at a temperature of 10 to 50° C., after which the reaction mixture is matured at 20 to 80° C.

Of the organic solvents, if used, water-soluble solvents are preferred. Suitable organic solvents include methanol, ethanol, 1-propanol, 2-propanol, 1-butanol, 2-butanol, 2-methyl-1-propanol, acetone, tetrahydrofuran, acetonitrile, and polyhydric alcohol condensation derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, and mixtures thereof.

The amount of the organic solvent used may be the same as described above for the one procedure. The resulting reaction mixture is post-treated as described above for the one procedure, yielding a silicon-containing compound (E).

The molecular weight of the resulting silicon-containing compound (E) may be adjusted by a choice of monomer(s) and by control of reaction conditions during polymerization. Compounds having a weight average molecular weight in excess of 1,000,000 may produce foreign matter or coating specks in some cases. Then the silicon-containing compound preferably has a weight average molecular weight equal to or less than 800,000, more preferably 200 to 500,000, and even more preferably 300 to 300,000. It is noted that the weight average molecular weight is determined by GPC using an RI detector or light scattering detector and polystyrene standards.

In the metal oxide-containing film-forming composition of the invention, the silicon-containing compound (E) may be compounded in any amount relative to component (A). Preferably they are combined such that the weight of component (A) is greater than the weight of component (E), i.e., (A)>(E).

To the inventive composition, water may be added. The addition of water causes the metal oxide-containing compound to be hydrated, ameliorating the lithography performance. The content of water is preferably from more than 0% to less than 50%, more preferably from 0.3% to 30%, even more preferably 0.5% to 20% by weight, based on the solvent component in the composition. Too high a water content may adversely affect the uniformity of a coated film and at the worst, cause cissing whereas too low a water content may undesirably detract from lithography performance.

The total amount of solvents including water is preferably 500 to 100,000 parts, more preferably 400 to 50,000 parts by weight per 100 parts by weight of the base polymer (A).

Others

In the composition, a photoacid generator may be used. Examples of the photoacid generator which can be used herein include:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.
(i) Onium Salts of Formula (P1a-1), (P1a-2) or (P1b):

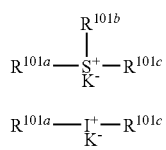

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy or other groups. Also, $R^{101b}$ and $R^{101c}$, taken together, may form a ring with the sulfur atom to which they are attached. $R^{101b}$ and $R^{101c}$ each are $C_1$-$C_6$ alkylene groups when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

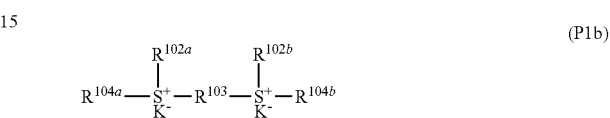

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

Herein, $R^{105}$ and $R^{106}$ independently represent straight, branched or cyclic alkyl or halogenated alkyl groups of 1 to 12 carbon atoms, substituted or unsubstituted aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

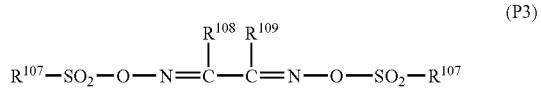

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring with the carbon atom to which they are attached. $R^{108}$ and $R^{109}$ each are straight or branched $C_1$-$C_6$ alkylene groups when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

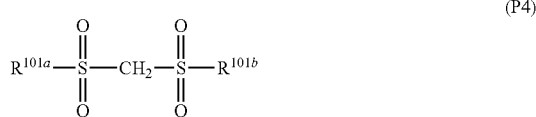

Herein, $R^{101a}$ and $R^{101b}$ are as defined above (v) Sulfonic acid esters of N-hydroxyimide compounds of formula (P5)

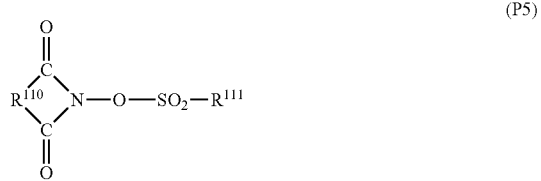

Herein, $R^{110}$ is a $C_6$-$C_{10}$ arylene group, $C_1$-$C_6$ alkylene group, or $C_2$-$C_6$ alkenylene group wherein some or all hydrogen atoms may be replaced by straight or branched $C_1$-$C_4$ alkyl or alkoxy groups, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; and the $C_1$-$C_4$ alkoxy groups include methoxy, ethoxy, propoxy, isopropoxy, n-butoxy, isobutoxy, and tert-butoxy. The phenyl groups which may have substituted thereon an $C_1$-$C_4$ alkyl or alkoxy, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the photoacid generator include:
onium salts such as diphenyliodonium trifluoromethanesulfonate,
(p-tert-butoxyphenyl)phenyliodonium trifluoromethanesulfonate, diphenyliodonium p-toluenesulfonate,
(p-tert-butoxyphenyl)phenyliodonium p-toluenesulfonate, triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate, triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane, bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;
β-ketosulfonic acid derivatives such as 2-cyclohexylcarbonyl-2-(p-toluenesulfonyl)propane and 2-isopropylcarbonyl-2-(p-toluenesulfonyl)propane;
disulfone derivatives such as diphenyl disulfone and dicyclohexyl disulfone;
nitrobenzyl sulfonate derivatives such as 2,6-dinitrobenzyl p-toluenesulfonate and 2,4-dinitrobenzyl p-toluenesulfonate;
sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethane-sulfonate, and
N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate,
tris(p-tert-butoxyphenyl)sulfonium trifluoromethanesulfonate, triphenylsulfonium p-toluenesulfonate,
(p-tert-butoxyphenyl)diphenylsulfonium p-toluenesulfonate, tris(p-tert-butoxyphenyl)sulfonium p-toluenesulfonate,
trinaphthylsulfonium trifluoromethanesulfonate, cyclohexylmethyl(2-oxocyclohexyl)sulfonium trifluoromethanesulfonate,
(2-norbornyl)methyl(2-oxocylohexyl)sulfonium trifluoroethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. An appropriate amount of the photoacid generator added is 0.01 to 50 parts, and more preferably 0.05 to 40 parts by weight, per 100 parts by weight of the base polymer (A).

In a preferred embodiment, a mono or polyhydric alcohol substituted with a cyclic ether may be added as a stabilizer to the metal oxide-containing film-forming composition so that the composition is further improved in stability. Specifically suitable alcohols include ether compounds having the structure shown below.

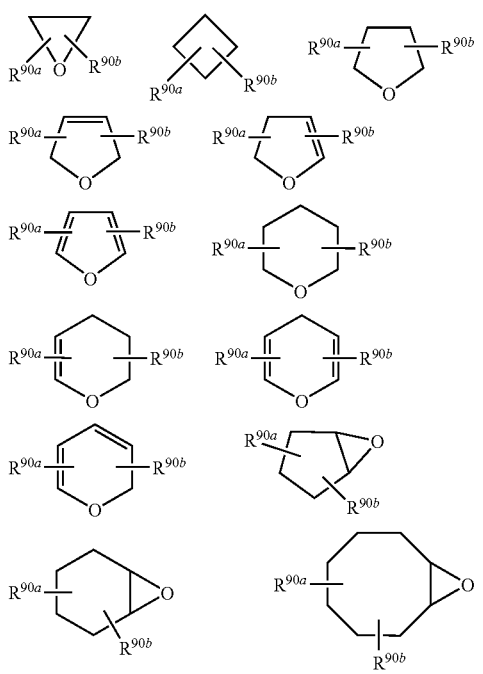
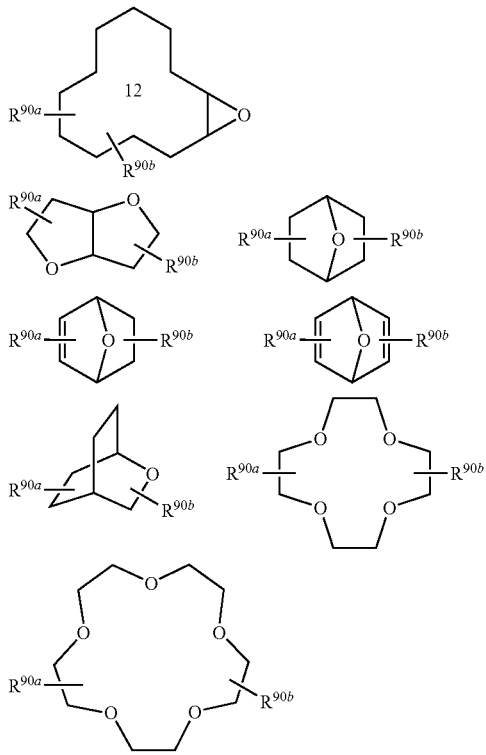
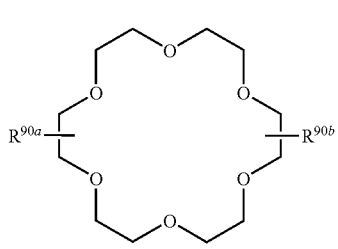
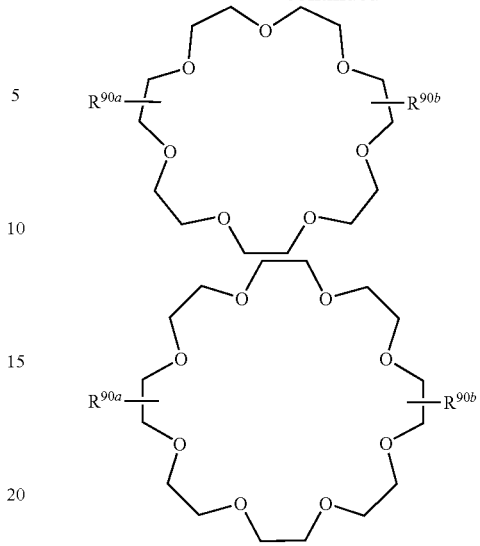

Herein $R^{90a}$ is hydrogen, a straight, branched or cyclic monovalent hydrocarbon group of 1 to 10 carbon atoms, $R^{91}O-CH_2CH_2O)_{n1}-(CH_2)_{n2}-$ (wherein $R^{91}$ is hydrogen or methyl, $0 \leq n1 \leq 5$, $0 \leq n2 \leq 3$), or $R^{92}O-[CH(CH_3)CH_2O]_{n3}-(CH_2)n_4-$ (wherein $R^{92}$ is hydrogen or methyl, $0 \leq n3 \leq 5$, $0 \leq n4 \leq 3$). $R^{90b}$ is hydroxyl, a straight, branched or cyclic monovalent hydrocarbon group of 1 to 10 carbon atoms having at least one hydroxyl group, $HO-(CH_2CH_2O)_{n5}-(CH_2)_{n6}-$ (wherein $1 \leq n5 \leq 5$, $1 \leq n6 \leq 3$), or $HO-[CH(CH_3)CH_2O]_{n7}-(CH_2)_{n8}-$ (wherein $1 \leq n7 \leq 5$, $1 \leq n8 \leq 3$).

The stabilizer may be used alone or in admixture. An appropriate amount of the stabilizer added is 0.001 to 50 parts, and preferably 0.01 to 40 parts by weight per 100 parts by weight of the base polymer (A). Stabilizers of the preferred structure include crown ether derivatives and compounds substituted with a bicyclo ring having an oxygen atom at the bridgehead. The addition of such a stabilizer helps to keep the electric charge of acid more stable, contributing to further stabilization of the metal oxide-containing compounds in the composition.

In the composition, a surfactant may optionally be compounded. The preferred surfactants are nonionic surfactants, for example, perfluoroalkyl polyoxyethylene ethanols, fluorinated alkyl esters, perfluoroalkylamine oxides, perfluoroalkyl ethylene oxide adducts, and fluorinated organosiloxanes. They are commercially available, for example, under the trade name of Fluorad FC-430, FC-431 and FC-4430 (Sumitomo 3M Co., Ltd.), Surflon S-141, S-145, KH-10, KH-20, KH-30 and KH-40 (Asahi Glass Co., Ltd.), Unidyne DS-401, DS-403 and DS-451 (Daikin Industries Ltd.), Megaface F-8151 (Dai-Nippon Ink & Chemicals, Inc.), X-70-092 and X-70-093 (Shin-Etsu Chemical Co., Ltd.). Inter alia, Fluorad FC-4430, KH-20, KH-30, and X-70-093 are preferred.

The surfactant is added to the composition in an ordinary amount as long as the objects of the invention are not compromised, preferably in an amount of 0 to 10 parts, more preferably 0 to 5 parts by weight, per 100 parts by weight of the base polymer (A).

A metal oxide-containing film useful as an etching mask can be formed on a substrate from the metal oxide-containing film forming composition of the invention by spin coating or similar techniques, as is the photoresist film. After spin coating, the coating is desirably baked to evaporate off the solvent and to promote crosslinking reaction for preventing the coating from mixing with the overlying resist film. The baking step is preferably effected at a temperature of 50 to 500° C. for a time of 10 to 300 seconds. While the preferred temperature range varies depending on the structure of a device to be manufactured, it is typically equal to or lower than 400° C. in order to minimize thermal damage to the device.

According to the invention, a pattern can be formed by forming a metal oxide-containing film, as described above, on a processable portion of a processable substrate via an intervening undercoat film, and forming a photoresist film on the metal oxide-containing film. The processable portion of a processable substrate may be a low-dielectric constant insulating film having a k value of up to 3, a primarily processed low-dielectric constant insulating film, a nitrogen and/or oxygen-containing inorganic film, a metal film or the like. The undercoat layer is preferably an organic film. The resist composition from which the photoresist film is formed is preferably a silicon-free, chemically amplified resist composition.

More specifically, the processable substrate (i.e., substrate to be processed or patterned) may be a processable layer or portion formed on a base substrate. The base substrate is not particularly limited and may be made of any material which is selected from Si, amorphous silicon ($\alpha$-Si), polycrystalline silicon (p-Si), $SiO_2$, SiN, SiON, W, TiN, Al, etc., but different from the processable layer. The processable layer may be any of films of Si, $SiO_2$, SiN, SiON, p-Si, $\alpha$-Si, W, W—Si, Al, Cu, Al—Si, etc., and various low dielectric films and etching stop films thereof and generally has a thickness of 50 to 10,000 nm, preferably 100 to 5,000 nm.

In a further embodiment, an antireflective coating (ARC) may be formed between the metal oxide-containing film and the overcoat resist film using a commercially available ARC material. Usually the ARC is formed of a compound having an aromatic substituent group. The ARC must be selected so as to impose little or no etching load to the overcoat resist film when the pattern of the overcoat resist film is transferred by dry etching. For example, if the thickness of the ARC is equal to or less than 80%, preferably equal to or less than 50% of the thickness of the overcoat resist film, the load applied during dry etching is minimized. In this embodiment, the ARC is preferably adjusted to a minimum reflectance equal to or less than 2%, more preferably equal to or less than 1%, and even more preferably equal to or less than 0.5%.

When the metal oxide-containing film of the invention is used in the exposure process using ArF excimer laser radiation, the overcoat resist film may be any of ordinary ArF excimer laser lithography resist compositions. There are known a number of candidates for the ArF excimer laser lithography resist composition, including resist compositions of the positive working type primarily comprising a polymer which becomes soluble in an alkaline aqueous solution as a result of decomposition of acid labile groups under the action of an acid, a photoacid generator, and a basic compound for controlling acid diffusion; and resist compositions of the negative working type primarily comprising a polymer which becomes insoluble in an alkaline aqueous solution as a result of reaction with a crosslinker under the action of an acid, a photoacid generator, a crosslinker, and a basic compound for controlling acid diffusion. Properties of a resist composition differ depending on what type of polymer is used. Well-known polymers are generally classified into poly(meth)acrylic, cycloolefin/maleic anhydride (COMA) copolymer, COMA-(meth)acrylic hybrid, ring-opening metathesis polymerization (ROMP), and polynorbornene systems. Of these, a resist composition comprising a poly(meth)acrylic polymer has superior resolution to other polymers because etching resistance is achieved by introducing an alicyclic skeleton into side chain.

There are known a number of ArF excimer laser lithography resist compositions comprising poly(meth)acrylic polymers. For the positive type, a polymer is composed of a combination of units for providing the main function of etching resistance, units which turn to be alkali soluble as a result of decomposition under the action of an acid, and units for providing adhesion, or in some cases, a combination comprising one unit capable of providing two or more of the above-mentioned functions. As the unit which changes alkali solubility under the action of an acid, (meth)acrylic acid esters having an acid labile group with an adamantane skeleton (see JP-A 9-73173) and (meth)acrylic acid esters having an acid labile group with a norbornane or tetracyclododecane skeleton (see JP-A 2003-84438) are advantageously used because they provide high resolution and etching resistance. As the unit which ensures adhesion, (meth)acrylic acid esters having a norbornane side chain with a lactone ring (see WO 00/01684), (meth)acrylic acid esters having an oxanorbornane side chain (see JP-A 2000-159758), and (meth)acrylic acid esters having a hydroxyadamantyl side chain (see JP-A 8-12626) are advantageously used because they provide satisfactory etching resistance and high resolution. Further, a polymer comprising units having as a functional group an alcohol which exhibits acidity by fluorine substitution on the vicinal carbon (see Polym. Mater. Sci. Eng., 1997, 77, pp 449) draws attention as a resist polymer complying with the immersion lithography of the current great interest because the units impart anti-swelling physical properties and hence, high resolution to the polymer. However, a decline of etching resistance due to inclusion of fluorine within the polymer is a problem. The metal oxide-containing film (for etching mask) of the invention is advantageously used in combination with such an organic resist material which is relatively difficult to secure etching resistance.

After the metal oxide-containing film (for etching mask) is formed, a photoresist layer is formed thereon using a photoresist composition solution. Like the metal oxide-containing film (for etching mask), the photoresist composition solution is preferably applied by spin coating. Once the resist composition is spin coated, it is prebaked, preferably at 80 to 180° C. for 10 to 300 seconds. The coating is then exposed, followed by post-exposure bake (PEB) and development, yielding a resist pattern.

The metal oxide-containing film (for etching mask) is typically etched with fluorine-based gases such as fluorocarbon gases or the like. With these gases, the metal oxide-containing film (for etching mask) is etched at so high an etching rate that the overcoat resist film undergoes less slimming.

In the multilayer resist process using the metal oxide-containing film of the invention, an undercoat film is provided between the metal oxide-containing film and the processable substrate. When the undercoat film is used as an etching mask for the processable substrate, the undercoat film is preferably an organic film having an aromatic framework. When the undercoat film is a sacrificial film, it may be either an organic film or a silicon-containing material having a silicon content equal to or less than 15% by weight.

In the multilayer resist process using as the undercoat film an organic film which can serve as an etching mask for the processable substrate, the organic film is used in another process involving transferring the resist pattern resulting from previous pattern formation to the metal oxide-containing film and transferring again the pattern of metal oxide-containing film to the organic film, and specifically, in the second transfer step. Then the organic film should have such characteristics that it can be etch processed under the etching conditions to which the metal oxide-containing film is highly resistant, but it is highly resistant to the etching conditions under which the processable substrate is etch processed.

With respect to the organic film as the undercoat film, there are known a number of films including undercoat films for the tri-layer resist process and undercoat films for the bi-layer resist process using silicon resist compositions. A number of resins including 4,4'-(9H-fluoren-9-ylidene)bisphenol novolac resin with a molecular weight of 11,000 as described in JP-A 2005-128509 and other novolac resins are known as the resist undercoat film material for the bi- or trilayer resist process, and any of them can be used herein. If it is desired to enhance heat resistance beyond ordinary novolac resins, it is possible to incorporate polycyclic skeletons as in 4,4'-(9H-fluoren-9-ylidene)bisphenol novolac resins or to select polyimide resins (e.g., JP-A 2004-153125).

The organic film can be formed on a substrate from a composition solution by spin coating or similar techniques like the photoresist composition. After the resist undercoat film is formed by spin coating or the like, it is desirably baked to evaporate off the organic solvent. The baking is preferably effected at a temperature of 80 to 300° C. for a time of 10 to 300 seconds.

Although the thickness of each film is not particularly limited and varies depending on etching conditions, the undercoat film preferably has a thickness of at least 10 nm, and more preferably from 50 nm to 50,000 nm, the metal oxide-containing film preferably has a thickness from 1 nm to 200 nm, and the photoresist film preferably has a thickness from 1 nm to 300 nm.

The tri-layer resist process using the metal oxide-containing film (for etching mask) according to the invention is described below. In the process, an organic film is first formed on a processable substrate by spin coating or similar techniques. This organic film is desired to have high etching resistance since it will serve as a mask during later etching of the processable substrate, and is also desired to be crosslinked by heat or acid after spin coating since it should be prevented from intermixing with an overlying metal oxide-containing film (for etching mask). On the organic film, a metal oxide-containing film (for etching mask) of the inventive composition and a photoresist film are formed by the above-described technique. In accordance with the standard procedure, the resist film is imagewise exposed to a light source selected for a particular resist film, for example, KrF excimer laser, ArF excimer laser or $F_2$ laser, heat treated under conditions selected for a particular resist film, and developed with a liquid developer, obtaining a resist pattern. While the resist pattern is made an etching mask, etching is carried out under dry etching conditions under which the etching rate of the metal oxide-containing film is dominantly high relative to the organic film, for example, dry etching with a fluorine gas plasma. When the ARC and the metal oxide-containing film are etch processed in this way, a pattern of the metal oxide-containing film is obtained without the substantial influence of pattern changes by side etching of the resist film. Then, the undercoat organic film is etched under dry etching conditions under which the etching rate of the undercoat organic film is dominantly high relative to the substrate (having the metal oxide-containing film pattern to which the resist pattern has been transferred as described above), for example, by reactive dry etching with an oxygen-containing gas plasma or reactive dry etching with a hydrogen/nitrogen-containing gas plasma. This etching step produces a pattern of the undercoat organic film while the resist layer as the uppermost layer is often lost at the same time. Further, while the thus patterned undercoat organic film is made an etching mask, the processable substrate is processed by dry etching, for example, fluorine dry etching or chlorine dry etching. The processable substrate can be etch processed at a high accuracy.

EXAMPLE

Synthesis Examples and Examples are given below together with Comparative Examples for further illustrating the invention although the invention is not limited thereby. All percents are by weight. The molecular weight (Mw) is determined by gel permeation chromatography (GPC) versus polystyrene standards.

Synthesis of Metal Oxide-Containing Compounds

Synthesis Example 1

A mixture of 10 g of phenyltrimethoxysilane, 20 g of 2-(3,4-epoxycyclohexyl)ethyltrimethoxysilane, 10 g of germanium tetrabutoxide, and 35 g of propylene glycol methyl ether was added to a mixture of 40 g of propylene glycol methyl ether, 1 g of methanesulfonic acid, and 50 g of deionized water. The mixture was held at 40° C. for 12 hours while hydrolytic condensation took place. Then the by-product alcohol was distilled off under a reduced pressure. To the reaction mixture, 800 ml of ethyl acetate and 300 ml of propylene glycol methyl ether were added. The water layer was separated off. To the remaining organic layer, 100 ml of deionized water was added, followed by agitation, static holding and separation. This operation was repeated three times. To the remaining organic layer, 200 ml of propylene glycol methyl ether was added. Concentration under a reduced pressure yielded 100 g of a propylene glycol methyl ether solution of metal oxide-containing compound #1 (polymer concentration 20%). The solution was analyzed for methanesulfonate ions by ion chromatography, but no ions were detected. The product had a Mw of 3,000.

Synthesis Example 2

A mixture of 10 g of phenyltrimethoxysilane, 20 g of 2-(3,4-epoxycyclohexyl)ethyltrimethoxysilane, 10 g of titanium tetrabutoxide, 20 g of 2,4-pentanedione, and 35 g of propylene glycol methyl ether was added to a mixture of 40 g of propylene glycol methyl ether, 1 g of methanesulfonic acid, and 50 g of deionized water. The mixture was held at 30° C. for 12 hours while hydrolytic condensation took place. Then the by-product alcohol was distilled off under a reduced pressure. To the remaining solution, 200 ml of propylene glycol methyl ether was added. Further concentration under a reduced pressure yielded 120 g of a propylene glycol methyl ether solution of metal oxide-containing compound #2 (polymer concentration 20%). The product had a Mw of 8,000.

Synthesis Example 3

A mixture of 10 g of phenyltrimethoxysilane, 20 g of 2-(3,4-epoxycyclohexyl)ethyltrimethoxysilane, 10 g of hafnium tetrapropoxide, and 35 g of propylene glycol ethyl ether was added to a mixture of 40 g of propylene glycol ethyl ether, 1 g of hydrochloric acid, and 50 g of deionized water. The mixture was held at 10° C. for 12 hours while hydrolytic condensation took place. Then the by-product alcohol was distilled off under a reduced pressure. To the remaining solution, 200 ml of propylene glycol ethyl ether was added. Further concentration under a reduced pressure yielded 100 g of a propylene glycol ethyl ether solution of metal oxide-containing compound #3 (polymer concentration 20%). The product had a Mw of 5,000.

Synthesis Example 4

A mixture of 70 g of tetramethoxysilane, 25 g of methyltrimethoxysilane, 25 g of a silane compound of formula (i), shown below, 10 g of aluminum trimethoxide, and 10 g of phenyltrimethoxysilane was added to a mixture of 1 g of 35% hydrochloric acid and 260 g of deionized water at room temperature. The mixture was held at room temperature for 8 hours while hydrolytic condensation took place. Then the by-product methanol was distilled off under a reduced pressure. To the remaining solution, 800 ml of ethyl acetate and 300 ml of propylene glycol propyl ether were added. The water layer was separated off. To the remaining organic layer, 100 ml of deionized water was added, followed by agitation, static holding and separation. This operation was repeated three times. To the remaining organic layer, 200 ml of propylene glycol monopropyl ether was added. Concentration under a reduced pressure yielded 300 g of a propylene glycol monopropyl ether solution of metal oxide-containing compound #4 (polymer concentration 20%). The solution was analyzed for chloride ions by ion chromatography, but no ions were detected. The product had a Mw of 2,500.

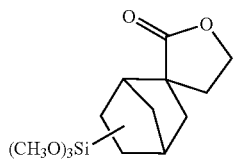

[i]

Synthesis Example 5

A mixture of 40 g of tetramethoxysilane, 10 g of methyltrimethoxysilane, 50 g of trimethyl borate, and 10 g of phenyltrimethoxysilane was added to a mixture of 200 g of ethanol, 100 g of deionized water, and 3 g of methanesulfonic acid at room temperature. The mixture was held at room temperature for 8 hours while hydrolytic condensation took place. Then the by-product methanol was distilled off under a reduced pressure. To the remaining solution, 800 ml of ethyl acetate and 300 ml of ethylene glycol monopropyl ether were added. The water layer was separated off. To the remaining organic layer, 100 ml of deionized water was added, followed by agitation, static holding and separation. This operation was repeated three times. To the remaining organic layer, 200 ml of ethylene glycol monopropyl ether was added. Concentration under a reduced pressure yielded 300 g of an ethylene glycol monopropyl ether solution of metal oxide-containing compound #5 (polymer concentration 20%). The solution was analyzed for methanesulfonate ions by ion chromatography, finding that 99% of the catalyst used in reaction had been removed. The product had a Mw of 2,100.

Synthesis Example 6

A mixture of 40 g of tetramethoxysilane, 10 g of methyltrimethoxysilane, 20 g of 2-(3,4-epoxycyclohexyl)-ethyltrimethoxysilane, and 10 g of phenyltrimethoxysilane was added to a mixture of 200 g of ethanol, 100 g of deionized water, and 3 g of methanesulfonic acid at room temperature. The mixture was held at room temperature for 8 hours while hydrolytic condensation took place. Then the by-product methanol was distilled off under a reduced pressure. To the remaining solution, 800 ml of ethyl acetate and 300 ml of ethylene glycol monopropyl ether were added. The water layer was separated off. To the remaining organic layer, 100 ml of deionized water was added, followed by agitation, static holding and separation. This operation was repeated three times. To the remaining organic layer, 200 ml of ethylene glycol monopropyl ether was added. Concentration under a reduced pressure yielded 300 g of an ethylene glycol monopropyl ether solution of metal oxide-containing compound #6 (polymer concentration 20%). The solution was analyzed for methanesulfonate ions by ion chromatography, finding that 99% of the catalyst used in reaction had been removed. The product had a Mw of 3,500.

Synthesis of Silicon-Containing Compounds

Synthesis Example 7

A 1,000-ml glass flask was charged with 500 g of ethanol, 250 g of deionized water, and 2.5 g of 25% tetramethylammonium hydroxide. While the mixture was stirred at 55° C., a mixture of 97 g of tetraethoxysilane and 73 g of methyltrimethoxysilane was added dropwise thereto over 2 hours. The mixture was stirred for one hour at 55° C. and then cooled to room temperature, after which 3 g of 20% maleic acid aqueous solution was added. To the solution, 1000 ml of propylene glycol monopropyl ether was added. The solution was concentrated to 900 ml. Thereafter, 2,000 ml of ethyl acetate was added to the concentrate, which was washed twice with 300 ml of deionized water and allowed to separate. The ethyl acetate layer was concentrated under reduced pressure, obtaining 900 g of a propylene glycol monopropyl ether solution of silicon-containing compound #7 (polymer concentration 7%). The product had a Mw of about 100,000.

Synthesis Example 8

A 1,000-ml glass flask was charged with 260 g of deionized water and 5 g of 65% nitric acid. A mixture of 70 g of tetraethoxysilane, 70 g of methyltrimethoxysilane, and 10 g of phenyltrimethoxysilane was added thereto at room temperature. The flask was held at room temperature for 8 hours while hydrolytic condensation took place. Then methanol and by-product ethanol were distilled off under reduced pressure. To the remaining solution, 800 ml of ethyl acetate and 300 ml of propylene glycol monopropyl ether were added. The water layer was separated off. To the remaining organic layer, 100 ml of 1% maleic acid aqueous solution was added, followed by agitation, static holding and separation. This operation was repeated two times. To the remaining organic layer, 100 ml of deionized water was added, followed by agitation, static holding and separation. This operation was repeated three times. To the remaining organic layer, 200 ml of propylene glycol monopropyl ether was added. Concentration under a reduced pressure yielded 300 g of a propylene glycol monopropyl ether solution of silicon-containing compound #8 (polymer concentration 21%). The product had a molecular weight (Mw) of 2,000.

Examples and Comparative Examples

Metal oxide-containing film-forming composition solutions were prepared by dissolving metal oxide-containing compounds (#1 to #6), silicon-containing compounds (#7, #8), acid, thermal crosslink accelerator, and additive in a solvent according to the formulation shown in Table 1, and passing through a fluoroplastic filter having a pore size of 0.1 µm. These solutions are designated Sol. 1 to 18.

TABLE 1

| | | Metal oxide-containing film-forming composition | | | | | |
|---|---|---|---|---|---|---|---|
| | Designation | Metal oxide-containing compound + Si-containing compound (pbw) | Thermal crosslink accelerator (pbw) | Acid (pbw) | Solvent (pbw) | Water/ stabilizer (pbw) | Other additive (pbw) |
| Example | | | | | | | |
| 1 | Sol. 1 | #1 (4.0) | TPSOAc (0.04) | maleic acid (0.04) | propylene glycol methyl ether (100) | — | — |
| 2 | Sol. 2 | #1 (4.0) | TPSOH (0.04) | oxalic acid (0.04) | propylene glycol methyl ether (100) | water (10) | — |
| 3 | Sol. 3 | #1 (4.0) | TPSCl (0.04) TPSOAc (0.003) | maleic acid (0.04) | propylene glycol methyl ether (100) | water (10) | TPSNf (0.02) |
| 4 | Sol. 4 | #1 (4.0) | TPSMA (0.04) TMAOAc (0.003) | maleic acid (0.04) oxalic acid (0.04) | propylene glycol methyl ether (100) | water (10) Stabilizer 1 (5) | — |
| 5 | Sol. 5 | #1 (4.0) #7 (0.4) | TPSN (0.04) | maleic acid (0.04) oxalic acid (0.04) | propylene glycol methyl ether (100) | water (10) Stabilizer 1 (5) | — |
| 6 | Sol. 6 | #1 (4.0) #8 (0.4) | TPSMA (0.04) | maleic acid (0.04) | propylene glycol methyl ether (100) | Stabilizer 1 (5) | — |
| 7 | Sol. 7 | #1 (3.2) #7 (0.4) #8 (0.4) | TPSOAc (0.04) | fumaric acid (0.04) | propylene glycol methyl ether (100) | Stabilizer 1 (5) | — |
| 8 | Sol. 8 | #2 (4.0) | TPSOAc (0.04) | maleic acid (0.04) | propylene glycol methyl ether (100) | water (10) Stabilizer 2 (5) | — |
| 9 | Sol. 9 | #2 (4.0) | TPSMA (0.04) | meleic acid (0.04) | propylene glycol methyl ether (100) | water (10) Stabilizer 2 (5) | — |
| 10 | Sol. 10 | #3 (4.0) | TPSOAc (0.04) | maleic acid (0.04) | propylene glycol ethyl ether (100) | water (10) Stabilizer 2 (5) | — |
| 11 | Sol. 11 | #3 (4.0) | TPSOH (0.04) | maleic acid (0.04) | propylene glycol ethyl ether (100) | water (10) Stabilizer 3 (5) | — |
| 12 | Sol. 12 | #4 (4.0) | TPSMA (0.04) | maleic acid (0.04) | propylene glycol propyl ether (100) | water (10) Stabilizer 3 (5) | — |
| 13 | Sol. 13 | #4 (4.0) | TPSOAc (0.04) | maleic acid (0.04) | propylene glycol propyl ether (100) | water (10) Stabilizer 4 (5) | — |
| 14 | Sol. 14 | #5 (4.0) | TPSMA (0.04) | maleic acid (0.04) | propylene glycol propyl ether (100) | water (10) Stabilizer 4 (5) | — |
| 15 | Sol. 15 | #5 (4.0) | TPSN (0.04) | maleic acid (0.04) | propylene glycol propyl ether (100) | water (10) Stabilizer 5 (5) | — |
| Comparative Example | | | | | | | |
| 1 | Sol. 16 | #6 (4.0) | TPSMA (0.04) | maleic acid (0.04) | propylene glycol propyl ether (100) | water (10) Stabilizer 5 (5) | — |
| 2 | Sol. 17 | #1 (4.0) | — | maleic acid (0.04) | propylene glycol propyl ether (100) | water (10) Stabilizer 5 (5) | — |

TABLE 1-continued

| | | Metal oxide-containing film-forming composition | | | | | |
| --- | --- | --- | --- | --- | --- | --- | --- |
| | Designation | Metal oxide-containing compound + Si-containing compound (pbw) | Thermal crosslink accelerator (pbw) | Acid (pbw) | Solvent (pbw) | Water/ stabilizer (pbw) | Other additive (pbw) |
| 3 | Sol. 18 | #1 (4.0) | TPSMA (0.04) | — | propylene glycol propyl ether (100) | water (10) Stabilizer 5 (5) | — |

TPSOAc: triphenylsulfonium acetate
    (photo-degradable thermal crosslink accelerator)
TPSOH: triphenylsulfonium hydroxide
    (photo-degradable thermal crosslink accelerator)
TPSCl: triphenylsulfonium chloride
    (photo-degradable thermal crosslink accelerator)
TPSMA: mono(triphenylsulfonium) maleate
    (photo-degradable thermal crosslink accelerator)
TPSN: triphenylsulfonium nitrate
    (photo-degradable thermal crosslink accelerator)
TMAOAc: tetramethylammonium acetate
    (non-photo-degradable thermal crosslink accelerator)
TPSNf: triphenylsulfonium nonafluorobutanesulfonate
    (photoacid generator)

Stabilizer 1:

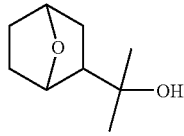

Stabilizer 2:

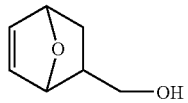

Stabilizer 3:

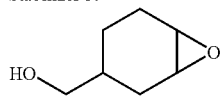

Stabilizer 4:

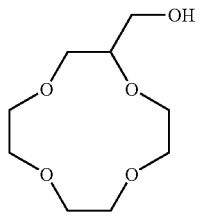

Stabilizer 5:

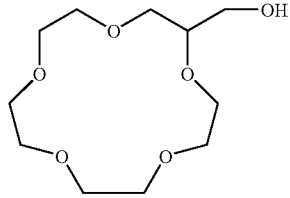

First, an undercoat-forming material, specifically a composition containing 28 parts by weight of a 4,4'-(9H-fluoren-9-ylidene)bisphenol novolac resin with a molecular weight of 11,000 and 100 parts by weight of PGMEA solvent (see JP-A 2005-128509) was spin coated onto a silicon wafer and baked at 200° C. for 1 minute to form an undercoat organic film of 300 nm thick. While a number of resins including the above-specified resin and other novolac resins are known as the undercoat organic film material for the multilayer resist process, any of them can be used herein.

Next, each of the metal oxide-containing film forming solutions (Sol. 1 to 18) was spin coated and baked at 200° C. for 1 minute to form a metal oxide-containing film of 100 nm thick.

Further, to form an overcoat resist film, a resist composition for ArF excimer laser lithography (designated Resist 1) was prepared by dissolving 10 parts by weight of a resin, identified below, 0.2 part by weight of triphenylsulfonium nonafluorobutanesulfonate as a photoacid generator and 0.02 part by weight of triethanolamine as a basic compound in propylene glycol monomethyl ether acetate (PGMEA) containing 0.1 wt % of Fluorad FC-430 (3M-Sumitomo Co., Ltd.) and passing through a fluoroplastic filter having a pore size of 0.1 μm.

Resin:

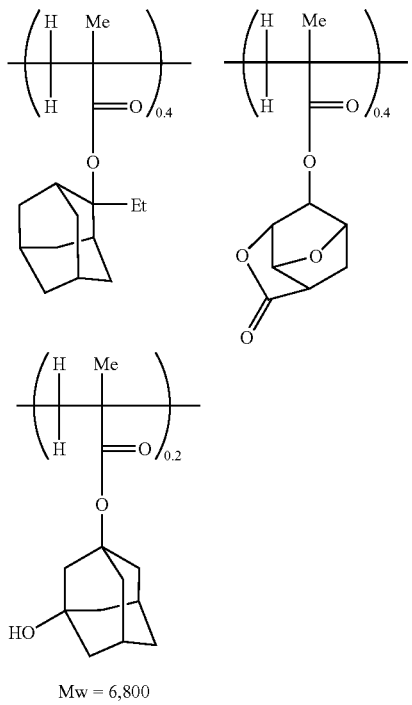

Mw = 6,800

(Me=methyl, Et=ethyl)

The resist composition was coated onto the metal oxide-containing intermediate film and baked at 130° C. for 60 seconds to form a photoresist layer of 200 nm thick.

Thereafter, the resist layer was exposed using an ArF laser stepper S305B (Nikon Corporation, NA 0.68, σ 0.85, ⅔ annular illumination, Cr mask), then baked (PEB) at 110° C. for 90 seconds, and developed with a 2.38 wt % aqueous solution of tetramethylammonium hydroxide (TMAH), thereby giving a positive pattern. The profile of the 90 nm line-and-space pattern was observed, with the results shown in Table 2.

TABLE 2

| | Pattern profile | |
|---|---|---|
| | Designation | Pattern profile |
| Example 1 | Sol. 1 | good |
| Example 2 | Sol. 2 | good |
| Example 3 | Sol. 3 | good |
| Example 4 | Sol. 4 | good |
| Example 5 | Sol. 5 | good |
| Example 6 | Sol. 6 | good |
| Example 7 | Sol. 7 | good |
| Example 8 | Sol. 8 | good |
| Example 9 | Sol. 9 | good |
| Example 10 | Sol. 10 | good |
| Example 11 | Sol. 11 | good |
| Example 12 | Sol. 12 | good |
| Example 13 | Sol. 13 | good |
| Example 14 | Sol. 14 | good |

TABLE 2-continued

| | Pattern profile | |
|---|---|---|
| | Designation | Pattern profile |
| Example 15 | Sol. 15 | good |
| Comparative Example 1 | Sol. 16 | good |
| Comparative Example 2 | Sol. 17 | good |
| Comparative Example 3 | Sol. 18 | good |

In all Examples, the patterns were found to be free of substrate-proximate footing, undercut and intermixing phenomena.

Next, dry etching resistance was tested. Each of the metal oxide-containing film forming solutions (Sol. 1 to 18) was spin coated and baked at 200° C. for 1 minute to form an metal oxide-containing film of 100 nm thick (Films 1 to 18). An etching test was performed on these films, the undercoat film, and the photoresist film under the following set of etching conditions (1). The results are shown in Table 3.

(1) $CHF_3/CF_4$ Gas Etching Test
 Instrument: dry etching instrument TE-8500P by Tokyo Electron Ltd.
 Chamber pressure: 40.0 Pa
 RF power: 1,300 W
 Gap: 9 mm
 $CHF_3$ gas flow rate: 30 ml/min
 $CF_4$ gas flow rate: 30 ml/min
 Ar gas flow rate: 100 ml/min
 Treating time: 10 sec

TABLE 3

| | Metal oxide-containing film-forming composition | Metal oxide-containing film | $CHF_3/CF_4$ gas dry etching rate (nm/min) |
|---|---|---|---|
| Example 1 | Sol. 1 | Film 1 | 450 |
| Example 2 | Sol. 2 | Film 2 | 450 |
| Example 3 | Sol. 3 | Film 3 | 450 |
| Example 4 | Sol. 4 | Film 4 | 450 |
| Example 5 | Sol. 5 | Film 5 | 450 |
| Example 6 | Sol. 6 | Film 6 | 450 |
| Example 7 | Sol. 7 | Film 7 | 450 |
| Example 8 | Sol. 8 | Film 8 | 410 |
| Example 9 | Sol. 9 | Film 9 | 410 |
| Example 10 | Sol. 10 | Film 10 | 420 |
| Example 11 | Sol. 11 | Film 11 | 420 |
| Example 12 | Sol. 12 | Film 12 | 410 |
| Example 13 | Sol. 13 | Film 13 | 410 |
| Example 14 | Sol. 14 | Film 14 | 420 |
| Example 15 | Sol. 15 | Film 15 | 420 |
| Comparative Example 1 | Sol. 16 | Film 16 | 200 |
| Comparative Example 2 | Sol. 17 | Film 17 | 450 |
| Comparative Example 3 | Sol. 18 | Film 18 | 450 |
| Resist film | — | — | 120 |
| Undercoat film | — | — | 90 |

Separately, a rate of $O_2$ gas dry etching was examined under the following set of etching conditions (2). The results are shown in Table 4.

(2) $O_2$ Gas Etching Test
 Chamber pressure: 60.0 Pa
 RF power: 600 W
 Ar gas flow rate: 40 ml/min
 $O_2$ gas flow rate: 60 ml/min
 Gap: 9 mm
 Treating time: 20 sec

TABLE 4

| | Metal oxide-containing film | O$_2$ gas etching rate (nm/min) |
|---|---|---|
| Example 1 | Film 1 | 2 |
| Example 2 | Film 2 | 2 |
| Example 3 | Film 3 | 2 |
| Example 4 | Film 4 | 2 |
| Example 5 | Film 5 | 1 |
| Example 6 | Film 6 | 2 |
| Example 7 | Film 7 | 2 |
| Example 8 | Film 8 | 1 |
| Example 9 | Film 9 | 3 |
| Example 10 | Film 10 | 3 |
| Example 11 | Film 11 | 4 |
| Example 12 | Film 12 | 4 |
| Example 13 | Film 13 | 3 |
| Example 14 | Film 14 | 3 |
| Example 15 | Film 15 | 2 |
| Comparative Example 1 | Film 16 | 3 |
| Comparative Example 2 | Film 17 | 2 |
| Comparative Example 3 | Film 18 | 2 |
| Resist film | — | 250 |
| Undercoat film | — | 210 |

It is seen that as compared with the undercoat film and the overcoat resist film, the metal oxide-containing intermediate films have a low etching rate sufficient to use them as an etching mask in transferring the pattern to the underlying layer.

Furthermore, a shelf stability test was performed. The metal oxide-containing film forming compositions (Sol. 1 to 18) prepared above were stored at 30° C. for 3 months, following which they were coated by the above-mentioned technique. It was examined whether any change of film formation occurred before and after the storage. The results are shown in Table 5.

TABLE 5

| | Metal oxide-containing film-forming composition | State as coated |
|---|---|---|
| Example 1 | Sol. 1 | no thickness change, no pattern profile change |
| Example 2 | Sol. 2 | no thickness change, no pattern profile change |
| Example 3 | Sol. 3 | no thickness change, no pattern profile change |
| Example 4 | Sol. 4 | no thickness change, no pattern profile change |
| Example 5 | Sol. 5 | no thickness change, no pattern profile change |
| Example 6 | Sol. 6 | no thickness change, no pattern profile change |
| Example 7 | Sol. 7 | no thickness change, no pattern profile change |
| Example 8 | Sol. 8 | no thickness change, no pattern profile change |
| Example 9 | Sol. 9 | no thickness change, no pattern profile change |
| Example 10 | Sol. 10 | no thickness change, no pattern profile change |
| Example 11 | Sol. 11 | no thickness change, no pattern profile change |
| Example 12 | Sol. 12 | no thickness change, no pattern profile change |
| Example 13 | Sol. 13 | no thickness change, no pattern profile change |
| Example 14 | Sol. 14 | no thickness change, no pattern profile change |
| Example 15 | Sol. 15 | no thickness change, no pattern profile change |
| Comparative Example 1 | Sol. 16 | no thickness change, pattern stripped |
| Comparative Example 2 | Sol. 17 | 15% thickness increase, pattern stripped |
| Comparative Example 3 | Sol. 18 | 5% thickness increase, pattern stripped |

It is seen from Table 5 that all the compositions of Examples remain stable at 30° C. over 3 months, corresponding to shelf stability at room temperature over 6 months.

The composition of the invention and the metal oxide-containing film thereof are improved in stability and lithographic characteristics. The inventive composition enables pattern formation using the advanced high-NA exposure system and substrate processing by etching.

Japanese Patent Application No. 2007-303130 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A heat curable metal oxide-containing film-forming composition comprising
   (A) a metal oxide-containing compound obtained through hydrolytic condensation between one or multiple hydrolyzable silicon compounds having the general formula (1) and one or multiple hydrolyzable metal compounds having the general formula (2):

$$R^1{}_{m1}R^2{}_{m2}R^3{}_{m3}Si(OR)_{(4-m1-m2-m3)} \quad (1)$$

wherein R is an alkyl of 1 to 6 carbon atoms, $R^1$, $R^2$ and $R^3$ each are hydrogen or a monovalent organic group of 1 to 30 carbon atoms, m1, m2 and m3 each are 0 or 1, and m1+m2+m3 is an integer of 0 to 3, $$U(OR^4)_{m4}(OR^5)_{m5} \quad (2)$$

wherein U is an element selected from the group consisting of boron, gallium, germanium, bismuth, phosphorus, vanadium, arsenic, niobium, and tantlum, $R^4$ and $R^5$ each are an organic group of 1 to 30 carbon atoms, m4 and m5 each are an integer inclusive of 0, and m4+m5 is equal to the valence of U,
   (B) at least one compound having the general formula (3) or (4):

$$L_aH_bX \quad (3)$$

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue, $$M_aH_bA \quad (4)$$

wherein M is sulfonium, iodonium or ammonium, A is X or a non-nucleophilic counter ion, "a" and "b" are as defined above, and a+b is equal to the valence of hydroxyl group, organic acid residue or non-nucleophilic counter ion,
   (C) a mono or polyfunctional organic acid of 1 to 30 carbon atoms, and
   (D) an organic solvent.

2. The composition of claim 1, further comprising
(E) a silicon-containing compound obtained through hydrolytic condensation of one or multiple hydrolyzable silicon compounds having the general formula (5):

$$R^6_{m6}R^7_{m7}R^8_{m8}Si(OR^9)_{(4-m6-m7-m8)} \quad (5)$$

wherein $R^9$ is an alkyl of 1 to 6 carbon atoms, $R^6$, $R^7$ and $R^8$ each are hydrogen or a monovalent organic group of 1 to 30 carbon atoms, m6, m7 and m8 each are 0 or 1, and m6+m7+m8 is an integer of 0 to 3.

3. The composition of claim 1 wherein the metal oxide-containing compound (A) is obtained through hydrolytic condensation between the compounds having the general formulae (1) and (2) in the presence of an acid catalyst, wherein said hydrolytic condensation is conducted in the presence of an acid catalyst.

4. The composition of claim 3 wherein said acid catalyst comprises at least one compound selected from mineral acids and sulfonic acid derivatives.

5. The composition of claim 3 wherein the metal oxide-containing compound (A) comprises a metal oxide-containing compound obtained by substantially removing the acid catalyst from a reaction mixture resulting from hydrolytic condensation between the compounds having formulae (1) and (2).

6. The composition of claim 1 wherein the compound of formula (1) is used in a greater molar amount than the compound of formula (2) during hydrolytic condensation.

7. The composition of claim 1 wherein M in formula (4) is tertiary sulfonium, secondary iodonium, or quaternary ammonium.

8. The composition of claim 1 wherein M in formula (4) is photo-degradable.

9. The composition of claim 1, further comprising water.

10. The composition of claim 1, further comprising a photoacid generator.

11. The composition of claim 1, further comprising a mono or polyhydric alcohol substituted with a cyclic ether.

12. A metal oxide-containing film for use in a multilayer resist process involving the steps of forming an organic film on a processable substrate, forming a metal oxide-containing film thereon, further forming a resist film thereon from a silicon-free chemically amplified resist composition, patterning the resist film, patterning the metal oxide-containing film using the resist film pattern, patterning the underlying organic film with the metal oxide-containing film pattern made an etching mask, and etching the processable substrate with the patterned organic film made an etching mask, the metal oxide-containing film being formed from the composition of claim 1.

13. The metal oxide-containing film of claim 12 wherein the process further involves the step of disposing an organic antireflective coating between the resist film and the metal oxide-containing film.

14. A. substrate having formed thereon, in sequence, an organic film, a metal oxide-containing film of the composition of claim 1, and a photoresist film.

15. The substrate of claim 14 further having an organic antireflective coating between the metal oxide-containing film and the photoresist film.

16. The substrate of claim 14 wherein said organic film is a film having an aromatic framework.

17. A method for forming a pattern in a substrate, comprising the steps of:
providing the substrate of claim 14,
exposing a pattern circuit region of the photoresist film to radiation,
developing the photoresist film with a developer to form a resist pattern,
dry etching the metal oxide-containing film with the resist pattern made an etching mask,
etching the organic film with the patterned metal oxide-containing film made an etching mask, and
etching the substrate with the patterned organic film made an etching mask, for forming a pattern in the substrate.

18. A method for forming a pattern in a substrate, comprising the steps of:
providing the substrate of claim 15,
exposing a pattern circuit region of the photoresist film to radiation,
developing the photoresist film with a developer to form a resist pattern,
dry etching the organic antireflective coating and the metal oxide-containing film with the resist pattern made an etching mask,
etching the organic film with the patterned metal oxide-containing film made an etching mask, and
etching the substrate with the patterned organic, film made an etching mask, for forming a pattern in the substrate.

19. The patterning method of claim 17 wherein said organic film is a film having an aromatic framework.

20. The patterning method of claim 17 wherein the exposing step is carried out by photolithography using radiation having a wavelength equal to or less than 300 nm.

* * * * *